US012718722B2

(12) United States Patent
Yuan et al.

(10) Patent No.: US 12,718,722 B2
(45) Date of Patent: Aug. 25, 2026

(54) GATE DRIVE CIRCUIT AND DISPLAY PANEL

(71) Applicant: Wuhan China Star Optoelectronics Semiconductor Display Technology Co., Ltd., Wuhan (CN)

(72) Inventors: Bin Yuan, Wuhan (CN); Xingyu Zhou, Wuhan (CN); Cheng Chen, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 91 days.

(21) Appl. No.: 18/505,235

(22) Filed: Nov. 9, 2023

(65) Prior Publication Data

US 2025/0037632 A1 Jan. 30, 2025

(30) Foreign Application Priority Data

Jul. 24, 2023 (CN) ......................... 202310923244.6

(51) Int. Cl.
*G11C 19/00* (2006.01)
*G09G 3/20* (2006.01)
*G11C 19/28* (2006.01)

(52) U.S. Cl.
CPC ............ *G09G 3/20* (2013.01); *G11C 19/287* (2013.01); *G09G 2300/0819* (2013.01); *G09G 2300/0852* (2013.01); *G09G 2310/0267* (2013.01); *G09G 2310/0286* (2013.01); *G09G 2310/08* (2013.01); *G09G 2330/021* (2013.01)

(58) Field of Classification Search
CPC .................. G09G 3/20; G09G 3/3677; G09G 2310/0286; G11C 19/28
See application file for complete search history.

(56) References Cited

U.S. PATENT DOCUMENTS 4,623,908 A * 11/1986 Oshima ................ G09G 3/3677 377/79
5,598,106 A * 1/1997 Kawasaki ........ H03K 19/00315 326/121
8,018,264 B2 * 9/2011 Ueno .............. H03K 3/356165 326/86
12,183,266 B1 * 12/2024 Zhang ...................... G09G 3/20
2021/0320650 A1 * 10/2021 Saha ...................... H03K 3/037
2024/0420621 A1 * 12/2024 Zhang ................. G09G 3/3677

FOREIGN PATENT DOCUMENTS

CN 116722860 A * 9/2023

* cited by examiner

*Primary Examiner* — Tuan T Lam
(74) *Attorney, Agent, or Firm* — Menachem Nathan; Nathan & Associates

(57) ABSTRACT

The present disclosure discloses a gate drive circuit and a display panel. The gate drive circuit includes a plurality of shift registers. Each shift register includes a level transmission signal selection module, a pull-up control module, a pulse quantity reduction module, a first inverting module, a first output module, a second output module, and a voltage boosting module. By connecting the voltage boosting module between a second electrode of a second transistor and a low potential line in series, when a first transistor is turned on, a potential of the second electrode of the second transistor can be increased, and on-state current of the second transistor can be reduced, so that a pulse amplitude of a second gate drive signal can be increased and stabilized.

9 Claims, 19 Drawing Sheets

STV/Nout[N-Y]
10
T13 O VGH
VGL T12
XCK T2 20
RST
30
C2
VGL
80
40
CK
Q
K T11 W T8 T6
C1
50
VGH
90
CK T4
70
T9 VGH
Pout[N]
T10
46
T3
T5
60
T1
p
T7
T15 B
VGH
Nout[N]
VGH
VGL
72
VGL Impact of different channel lengths on delay time and an output voltage 3
2.5
2
1.5
1
0.5
0

-6.4
-6.5
-6.6
-6.7
-6.8
-6.9
-7
-7.1

Output voltage

Delay time

Delay time (ns)

Voltage of a node B (V)

0
20
40
60
80
100

Channel length (um)

GATE DRIVE CIRCUIT AND DISPLAY PANEL

CROSS-REFERENCE TO RELATED APPLICATION

The present disclosure claims priority to and the benefit of Chinese Patent Application No. 202310923244.6, filed on Jul. 24, 2023, the disclosure of which is incorporated herein by reference in its entirety.

FIELD OF INVENTION

The present disclosure relates to the field of display technologies, and in particular, to a gate drive circuit and a display panel.

BACKGROUND OF INVENTION

In a display panel, a gate drive circuit is usually configured to provide corresponding gate drive signals for different transistors. Stability of the gate drive signals is particularly critical to operating stability of the transistors.

However, a pulse amplitude of the gate drive signal provided by the gate drive circuit is small, and consequently, undesirable situations may easily occur during the process of driving a corresponding transistor in a pixel circuit, resulting in reduced reliability of the gate drive circuit.

SUMMARY OF INVENTION

The present disclosure provides a gate drive circuit and a display panel, so as to alleviate the technical problem of small pulse amplitude of a gate drive signal.

According to a first aspect, the present disclosure provides a gate drive circuit and a display panel. The gate drive circuit includes a plurality of shift registers. Each of the plurality of shift registers includes a level transmission signal selection module, a pull-up control module, a pulse quantity reduction module, a first inverting module, a first output module, a second output module, and a voltage boosting module. The level transmission signal selection module is electrically connected between a first wire and a first node. The pull-up control module controls a potential of a second node based on a potential of the first node and a potential of a first clock signal. The pulse quantity reduction module is electrically connected between the second node and a third node. A control end of the pulse quantity reduction module is electrically connected to a reset line. The first inverting module is connected between the second node and a fourth node. The first output module outputs a first gate drive signal based on a potential of the third node and a potential of the fourth node. The second output module includes a P-channel first transistor and an N-channel second transistor. A first electrode of the first transistor is electrically connected to a high potential line. A gate of the first transistor is electrically connected to the second node. A first electrode of the second transistor is electrically connected to a second electrode of the first transistor to output a second gate drive signal, and a gate of the second transistor is electrically connected to the gate of the first transistor. The voltage boosting module connected in series is connected between a second electrode of the second transistor and a low potential line in series. A control end of the voltage boosting module is electrically connected to the gate of the second transistor.

In some embodiments, the voltage boosting module includes at least one transistor. The at least one transistor connected in series is connected between the second electrode of the second transistor and the low potential line in series. Each gate of the at least one transistor is electrically connected to the gate of the second transistor.

In some embodiments, the at least one transistor includes a third transistor. A first electrode of the third transistor is electrically connected to the second electrode of the second transistor. A second electrode of the third transistor is electrically connected to the low potential line. A gate of the third transistor is electrically connected to the gate of the second transistor. A channel type of the third transistor is the same as a channel type of the second transistor.

In some embodiments, each of the gate of the second transistor and the gate of the third transistor includes a first gate and a second gate. The second node is electrically connected to the first gate of the second transistor, the second gate of the second transistor, the first gate of the third transistor, and the second gate of the third transistor.

In some embodiments, a potential of the second electrode of the second transistor is less than or equal to −6.7 V in a case that the third transistor is turned on. Both the second transistor and the third transistor are indium gallium zinc oxide thin film transistors.

In some embodiments, a channel width-to-length ratio of the third transistor is greater than or equal to 8.57 and less than or equal to 20. Both the second transistor and the third transistor are indium gallium zinc oxide thin film transistors.

In some embodiments, the at least one transistor further includes a fourth transistor. A first electrode of the fourth transistor is electrically connected to the second electrode of the third transistor. A second electrode of the fourth transistor is electrically connected to the low potential line. A gate of the fourth transistor is electrically connected to the gate of the second transistor. A channel type of the fourth transistor is the same as the channel type of the third transistor.

In some embodiments, the voltage boosting module is configured to increase the potential of the second electrode of the second transistor in a case that the potential of the second node is a low potential.

In some embodiments, the voltage boosting module is configured to increase and stabilize a high potential of the second gate drive signal.

According to a second aspect, the present disclosure provides a display panel. The display panel includes a plurality of pixel circuits and the gate drive circuit described in at least one of the embodiments. Each of the plurality of pixel circuits includes a write transistor that controls input of a data signal and a compensation transistor that controls the data signal to be input into a gate of a drive transistor. An output end of the first output module is electrically connected to a gate of the write transistor. An output end of the second output module is electrically connected to a gate of the compensation transistor.

For the gate drive circuit and the display panel provided in the present disclosure, by connecting the voltage boosting module between the second electrode of the second transistor and the low potential line in series, in a case that the first transistor is turned on, the potential of the second electrode of the second transistor can be increased, and on-state current of the second transistor can be reduced, so that a pulse amplitude of the second gate drive signal can be increased and stabilized. In addition, by increasing the potential of the second electrode of the second transistor, negative bias of a threshold voltage of the second transistor can be alleviated, so that a negative bias range of the threshold voltage of the second transistor can be increased, and abnormalities in the second gate drive signal can be avoided, thereby improving reliability of the gate drive circuit.

In addition, the second gate drive signal with more pulses may be output by the level transmission signal selection module, the pull-up control module, and the second output module. In addition, the second gate drive signal may be selected as a level transmission signal between different shift registers. Furthermore, the first gate drive signal with fewer pulses may be output by the level transmission signal selection module, the pull-up control module, the pulse quantity reduction module, the first inverting module, and the first output module. This can meet needs of a corresponding pixel circuit for the pulses gate drive signals in one frame in terms of time, quantity, and the like, thereby driving the pixel circuit to achieve high definition display.

BRIEF DESCRIPTION OF DRAWINGS

The technical solutions and other beneficial effects of the present disclosure will be apparent from the detailed description of specific embodiments of the present disclosure with reference to the accompanying drawings.

DETAILED DESCRIPTION OF PREFERRED EMBODIMENTS

The technical solutions of the embodiments of the present disclosure are clearly and completely described below with reference to the accompanying drawings of the embodiments of the present disclosure. Apparently, the described embodiments are merely some but not all of the embodiments of the present disclosure. All other embodiments obtained by a person skilled in the art based on the embodiments of the present disclosure without creative efforts shall fall within the protection scope of the present disclosure.

In addition, terms "first" and "second" are used merely for the purpose of description, and shall not be understood as indicating or implying relative importance or implying a quantity of indicated technical features. Therefore, the features defined by "first" or "second" may explicitly indicate or implicitly include one or more such features. In description of the present disclosure, "a plurality of" means two or more unless it is exemplarily defined otherwise.

Figure 1:
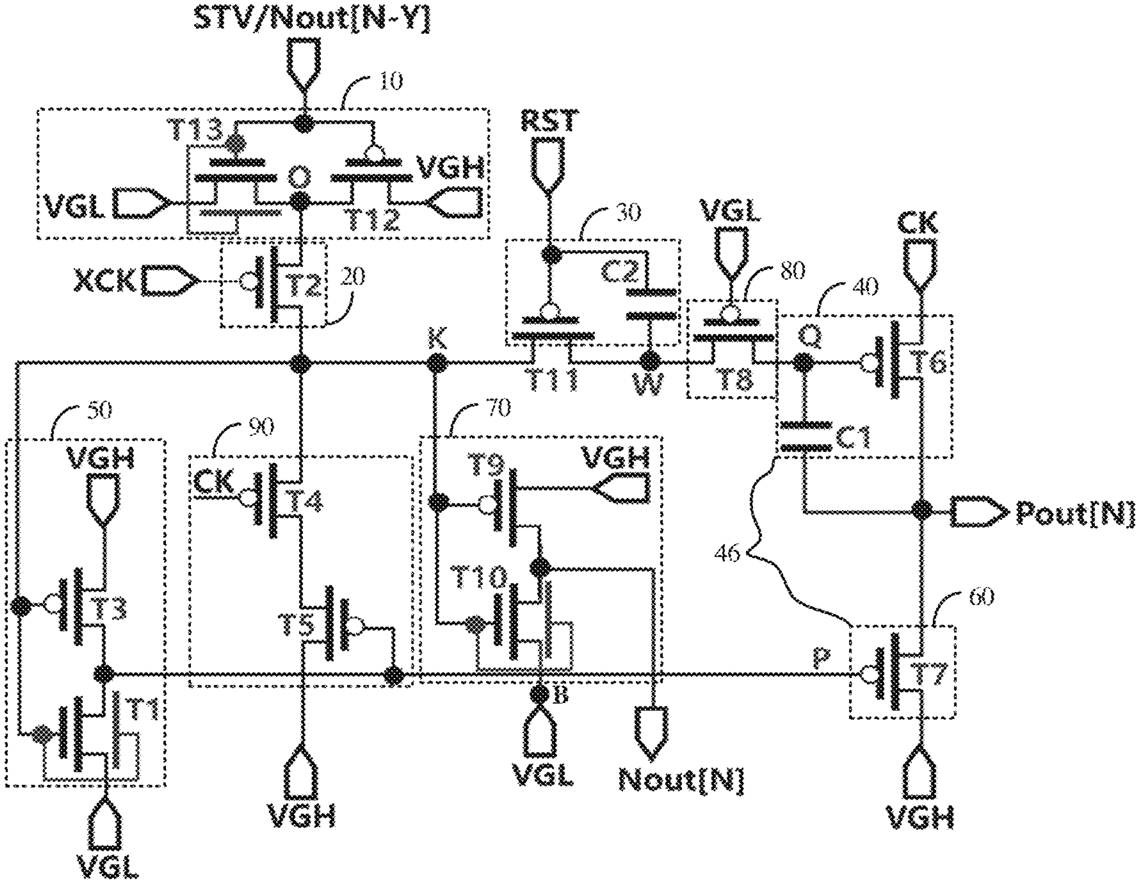
FIG. 1 is a schematic diagram of a structure of a gate drive circuit in the conventional technology.
Figure 2:
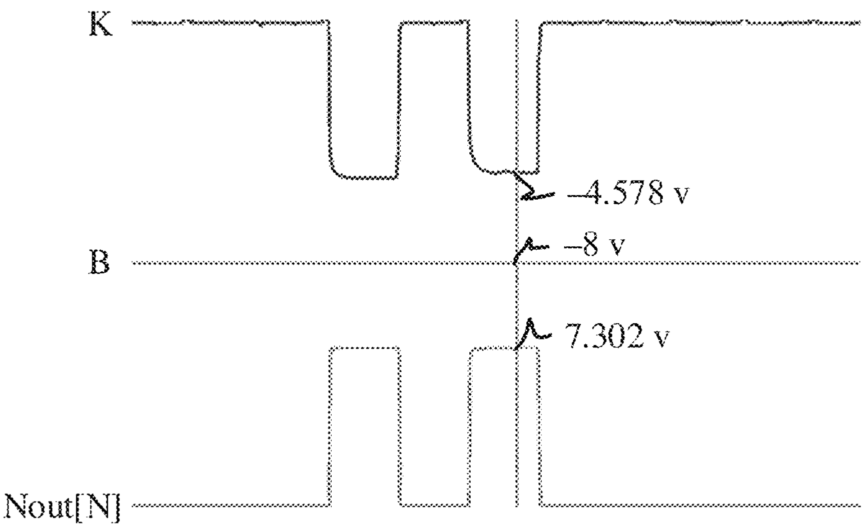
FIG. 2 is a schematic diagram of timing of some nodes in the gate drive circuit shown in FIG. 1.

Referring to FIG. 1 and FIG. 2, FIG. 1 is a schematic diagram of a structure of a gate drive circuit in the conventional technology. The gate drive circuit includes at least one of the following modules: a level transmission signal selection module 10, a pull-up control module 20, a pulse quantity reduction module 30, a first inverting module 50, a first output module 46, a second output module 70, a leakage prevention module 80, or a feedback module 90.

The first output module 46 includes a pull-up module 40 and a pull-down module 60. The first output module 46 outputs a first gate drive signal. The second output module 70 outputs a second gate drive signal.

For detailed description of the gate drive circuit, please refer to the following related descriptions.

However, during an application process, it is found that there are abnormalities in output stability of the gate drive circuit. For example, a high potential of the second gate drive signal is not as high as expected and has an obvious sag. After a plurality of investigations, it is found that this is caused by a coupling relationship between the first output module 46 and the second output module 70. In other words, in the gate drive circuit shown in FIG. 1, when the first output module 46 and the second output module 70 exist at the same time, such specific problem occurs, that is, the high potential of the second gate drive signal is not as high as expected. This further leads to a case that the gate drive circuit shown in FIG. 1 cannot meet both output requirements of the first gate drive signal and the second gate drive signal.

Exemplarily, FIG. 2 is a schematic diagram of timing of some nodes in the gate drive circuit shown in FIG. 1. In a case that the gate drive circuit shown in FIG. 1 is at a low potential at a second node K, such as at −4.578 V as shown in FIG. 2, a first transistor T9 is turned on, a second transistor T10 is turned off, and the second gate drive signal with a high potential may be output.

However, since a potential of a node B, that is, a potential of a low potential signal, is −8 V as shown in FIG. 2, and a gate-source voltage difference Vgs of the second transistor T10 is 3.422 V, there may be small leakage current. In this case, the high potential of the second gate drive signal is maintained only at 7.302 V as shown in FIG. 2, and consequently, it is difficult to achieve a desired pulse amplitude. In other words, a pulse amplitude of the second gate drive signal is small.

Figure 3:
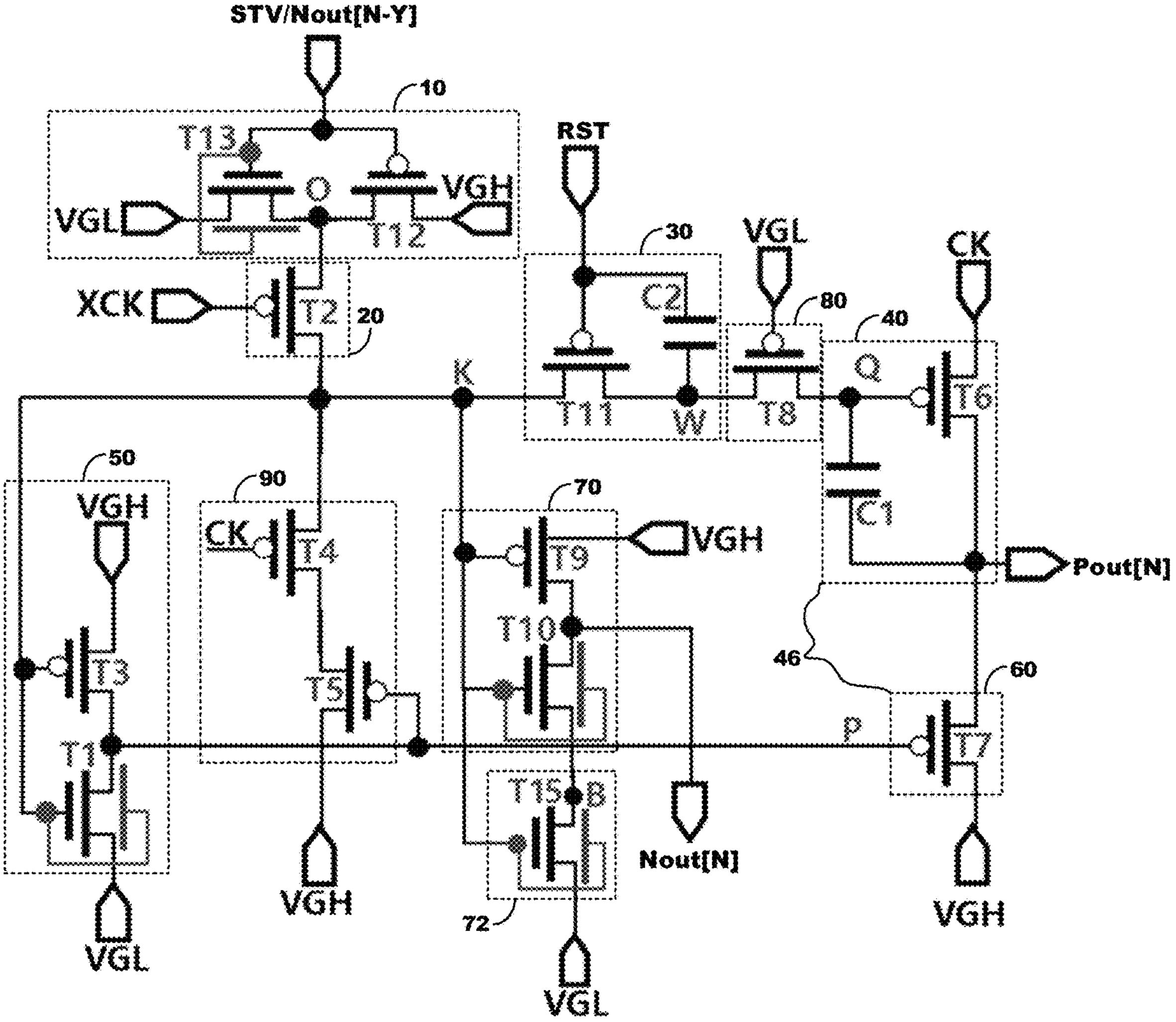
FIG. 3 is a schematic diagram of a structure of a gate drive circuit according to some embodiments of the present disclosure.

In view of this, the embodiments provide a gate drive circuit. Refer to FIGS. 3 to 22. As shown in FIG. 3, the gate drive circuit includes a plurality of shift registers. Each shift register includes at least one of the following modules: a level transmission signal selection module 10, a pull-up control module 20, a pulse quantity reduction module 30, a first inverting module 50, a first output module 46, a second output module 70, or a voltage boosting module 72.

The level transmission signal selection module 10 is electrically connected between a first wire and a first node O.

The pull-up control module 20 controls a potential of a second node K based on a potential of the first node O and a potential of a first clock signal.

The pulse quantity reduction module 30 is electrically connected between the second node K and a third node Q. A control end of the pulse quantity reduction module 30 is electrically connected to a reset line.

The first inverting module 50 is connected between the second node K and a fourth node P.

The first output module 46 outputs a first gate drive signal based on a potential of the third node Q and a potential of the fourth node P.

The second output module 70 includes a P-channel first transistor T9 and an N-channel second transistor T10. A first electrode of the first transistor T9 is electrically connected to a high potential line. A gate of the first transistor T9 is electrically connected to the second node K. A first electrode of the second transistor T10 is electrically connected to a second electrode of the first transistor T9 to output a second gate drive signal. A gate of the second transistor T10 is electrically connected to the gate of the first transistor T9.

The voltage boosting module 72 is connected between a second electrode of the second transistor T10 and a low potential line in series. A control end of the voltage boosting module 72 is electrically connected to the gate of the second transistor T10.

It may be understood that for the gate drive circuit provided in the embodiments, by connecting the voltage boosting module 72 between the second electrode of the second transistor T10 and the low potential line in series, in the case that the first transistor T9 is turned on, the potential of the second electrode of the second transistor T10 can be increased, and on-state current of the second transistor T10 can be reduced, so that a pulse amplitude of the second gate drive signal can be increased and stabilized. In addition, by increasing the potential of the second electrode of the second transistor T10, negative bias of a threshold voltage of the second transistor T10 can be alleviated, so that a negative bias range of the threshold voltage of the second transistor T10 can be increased, and abnormalities in the second gate drive signal can be avoided, thereby improving reliability of the gate drive circuit.

It should be noted that in the embodiments of the present disclosure, the voltage boosting module 72 can increase the potential of the second electrode of the second transistor T10 in a case that the potential of the second node K is a low potential, so that the on-state current or leakage current of the second transistor T10 can be decreased. Compared with a case that the leakage current exists, the potential of the second gate drive signal can be increased and stabilized. Optionally, the voltage boosting module 72 in the embodiments of the present disclosure can increase and stabilize a high potential of the second gate drive signal.

Figure 4:
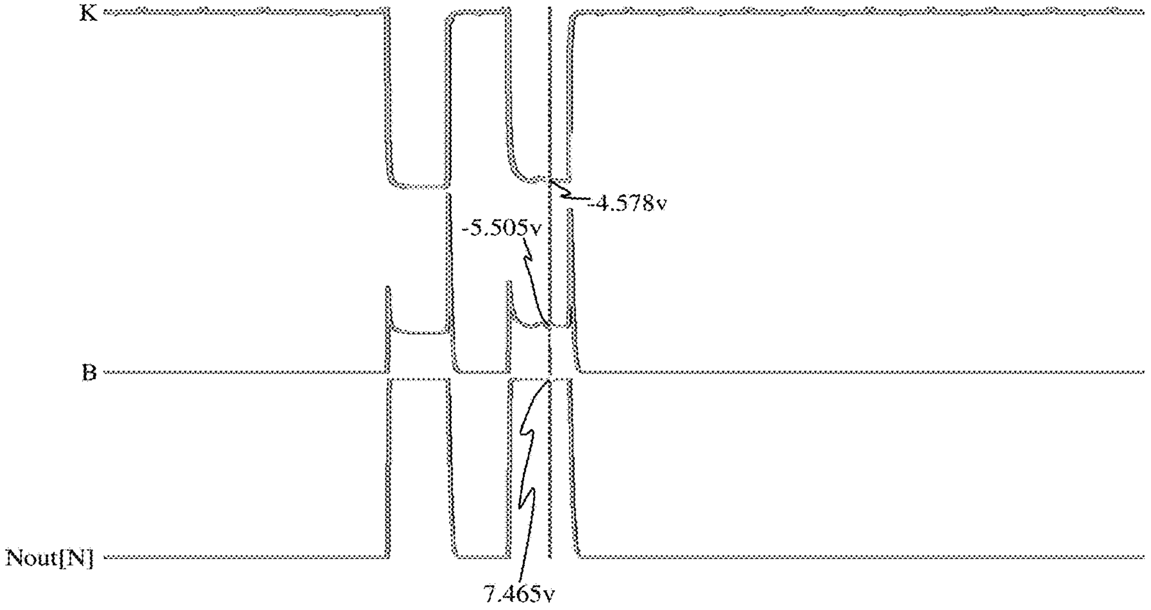
FIG. 4 is a schematic diagram of timing of some nodes in the gate drive circuit shown in FIG. 3.

FIG. 4 is used as an example. Compared with FIG. 2, the potential of the second node K does not change, and a potential of a node B increases from −8 V in FIG. 2 to −5.505 V as shown in FIG. 4. The high potential of the second gate drive signal increases from 7.302 V in FIG. 2 to 7.465 V as shown in FIG. 4. It may be understood that in this case, the second gate drive signal enables turn-on of the transistor controlled by the second gate drive signal to have a higher degree and be more stable, thereby improving reliability or stability of the gate drive circuit.

In some embodiments, the voltage boosting module 72 includes at least one transistor. The at least one transistor connected in series is connected between the second electrode of the second transistor T10 and the low potential line in series. Each gate of the at least one transistor is electrically connected to the gate of the second transistor T10.

It should be noted that in the embodiments of the present disclosure, the voltage boosting module 72 may include one or more transistors connected in series. With each additional transistor, the potential of node B may be increased. As a quantity of transistors increases, the leakage current of the second transistor T10 is to be smaller, so that the high potential of the second gate drive signal can be more easily maintained.

In some embodiments, the at least one transistor includes a third transistor T15. A first electrode of the third transistor T15 is electrically connected to the second electrode of the second transistor T10. A second electrode of the third transistor T15 is electrically connected to the low potential line. A gate of the third transistor T15 is electrically connected to the gate of the second transistor T10. A channel type of the third transistor T15 is the same as a channel type of the second transistor T10.

It should be noted that in a case that the second node K is at the low potential, the third transistor T15 is in a turn-off state but has leakage current, and there is resistance between the first electrode and second electrode of the third transistor T15. A potential of a low potential signal is increased to a higher potential after passing through the third transistor T15, so that a gate-source voltage difference of the second transistor T10 becomes lower, and the on-state current of the second transistor T10 becomes smaller.

In some embodiments, each of the gate of the second transistor T10 and the gate of the third transistor T15 includes a first gate and a second gate. The second node K is electrically connected to the first gate of the second transistor T10, the second gate of the second transistor T10, the first gate of the third transistor T15, and the second gate of the third transistor T15.

It should be noted that in the embodiments of the present disclosure, the second transistor T10 and the third transistor T15 may both be dual-gate thin film transistors. The dual-gate thin film transistor can not only improve an ability of controlling current flowing through the dual-gate thin film transistor, but also reduce a drift amplitude of the threshold voltage.

Figure 5:
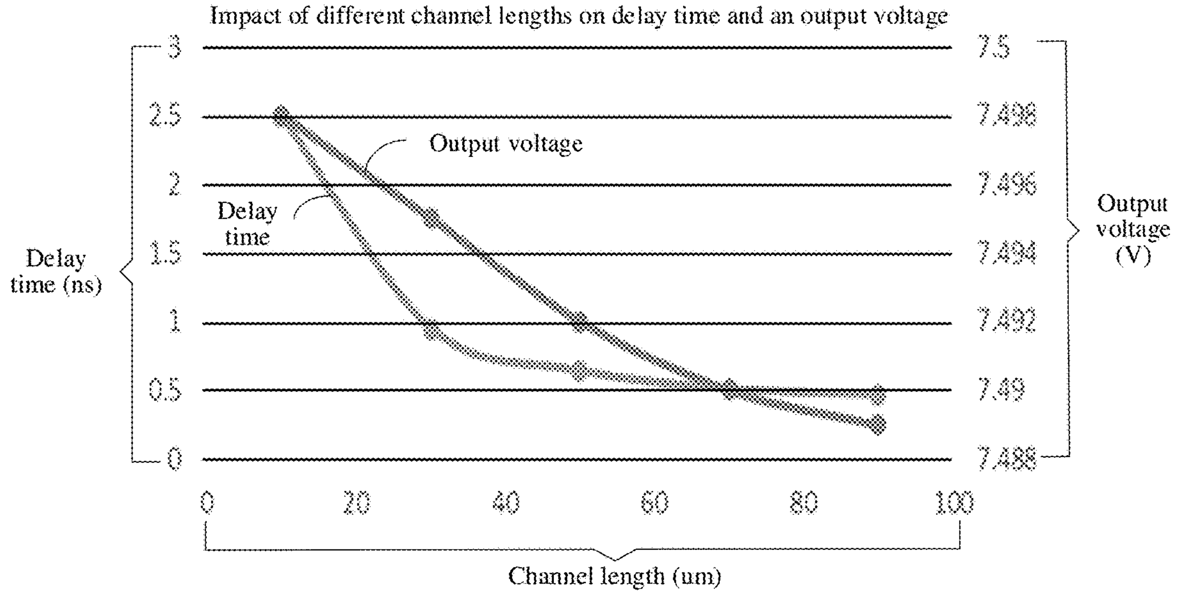
FIG. 5 is a schematic diagram of a relationship between delay time and an output voltage at different channel lengths of a transistor according to some embodiments of the present disclosure.

In some embodiments, as shown in FIG. 5, a problem may occur when delay time of a falling edge of the second gate drive signal is greater than 1 us, and a quantity of levels of level transmission in the gate drive circuit exceeds 200. After research, it is found that by increasing a channel width (W) of the third transistor T15 while keeping a channel length (L) of the third transistor T15 unchanged (for example, L=3.5 μm), the delay time of the falling edge of the second gate drive signal is reduced, and the high potential (an output voltage) of the second gate drive signal is reduced. Based on such comprehensive considerations, when the channel length of the third transistor T15 keeps unchanged, the channel width of the third transistor T15 is greater than or equal to 30 μm and less than or equal to 70 μm. To be specific, a channel width-to-length ratio of the third transistor T15 is greater than or equal to 8.57 and less than or equal to 20 (for example, the channel width-to-length ratio may be 8.6, 8.8, 9, 10, 11, 12, 15, 18, and the like). A larger channel width-to-length ratio indicates shorter delay time of the falling edge of the second gate drive signal.

Both the second transistor T10 and the third transistor T15 are indium gallium zinc oxide thin film transistors. It may be understood that after further research, the above channel width and the above channel length are found to be more suitable for indium gallium zinc oxide thin film transistors.

In some embodiments, a potential of the second electrode of the second transistor T10 is less than or equal to −6.7 V in a case that the third transistor T15 is turned on. Both the second transistor T10 and the third transistor T15 are indium gallium zinc oxide thin film transistors.

It should be noted that the second transistor T10 and the third transistor T15 use the same channel material, and can be implemented through the same manufacturing process, so that the process is simplified.

Figure 6:
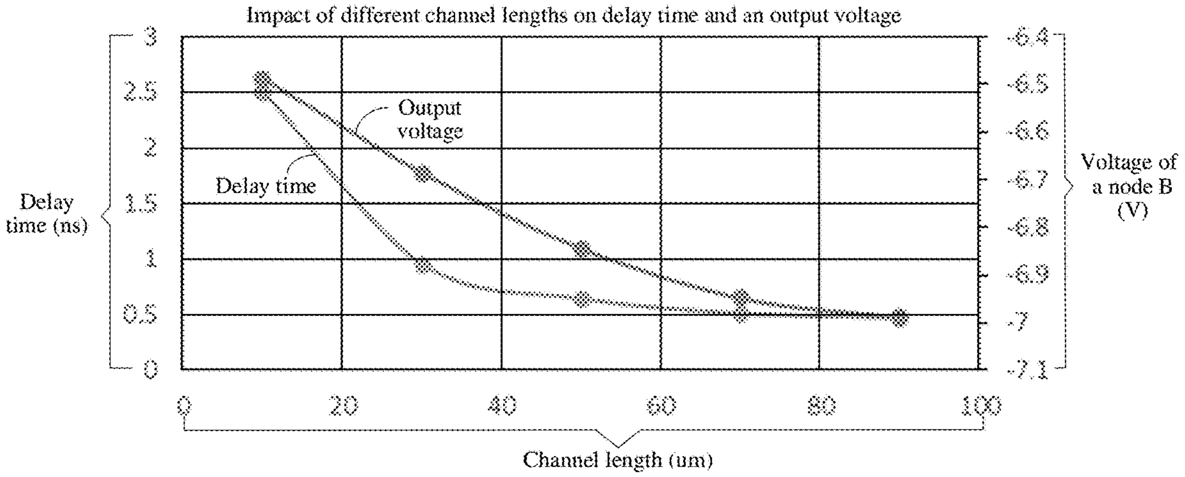
FIG. 6 is a schematic diagram of a relationship between delay time and a voltage of a node B at different channel lengths of a transistor according to some embodiments of the present disclosure.

As shown in FIG. 6, in a case that the channel width of the third transistor T15 is increased, a lower potential of the node B indicates a higher voltage of the second gate drive signal, and a higher potential of the node B indicates longer delay time (Delay) of the falling edge of the second gate drive signal. Therefore, based on considerations that a problem may occur in a case that the delay time of the falling edge of the second gate drive signal is greater than 1 us, and the quantity of the levels of the level transmission in the gate drive circuit exceeds 200, it is determined that the potential of the node B is ≤−6.7 V.

Figure 23:
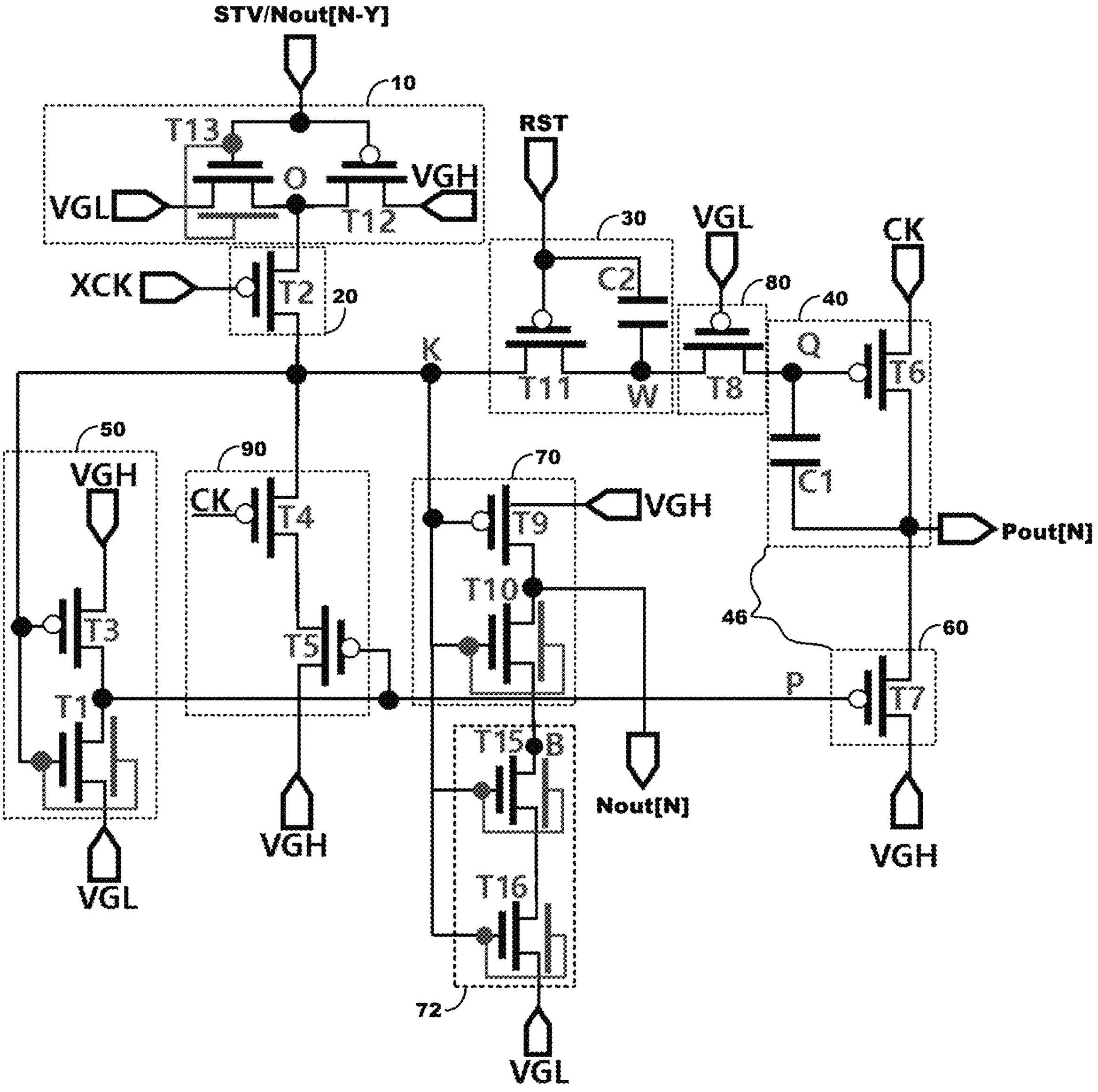
FIG. 23 is a schematic diagram of another structure of a gate drive circuit according to some embodiments of the present disclosure.

In some embodiments, as shown in FIG. 23, the at least one transistor further includes a fourth transistor T16. A first electrode of the fourth transistor T16 is electrically connected to the second electrode of the third transistor T15. A second electrode of the fourth transistor T16 is electrically connected to the low potential line. A gate of the fourth transistor T16 is electrically connected to the gate of the second transistor T10. A channel type of the fourth transistor T16 is same as the channel type of the third transistor T15.

It should be noted that in the embodiments of the present disclosure, the voltage boosting module 72 includes two transistors, the third transistor T15 and the fourth transistor T16, and the potential of the node B can be further increased, so that the leakage current of the second transistor T10 can be further reduced.

In some embodiments, the voltage boosting module 72 may alternatively include three, four or more transistors connected in series, to continuously reduce the leakage current of the second transistor T10.

In some embodiments, one voltage boosting module 72 may alternatively be connected between a transistor T1 and the low potential line in series, and one voltage boosting module 72 may alternatively be connected between a transistor T13 and the low potential line in series. For a detailed connection relationship, refer to a connection relationship between the second transistor T10 and the low potential line, which has the same function.

In some embodiments, the second output module 70 outputs the second gate drive signal based on the potential of the second node K. A quantity of pulses of the second gate drive signal in one frame is greater than a quantity of pulses of the first gate drive signal in one frame.

It should be noted that the gate drive circuit provided in the embodiments of the present disclosure may output a second gate drive signal with more pulses by the level transmission signal selection module 10, the pull-up control module 20, and the second output module 70. In addition, the second gate drive signal may be selected as a level transmission signal between different shift registers. Furthermore, the first gate drive signal with fewer pulses may be output by the level transmission signal selection module 10, the pull-up control module 20, the pulse quantity reduction module 30, the first inverting module 50, and the first output module 46. This can meet needs of a corresponding pixel circuit for the pulses of the gate drive signals in one frame in terms of time, quantity, and the like, thereby driving the pixel circuit to achieve high definition display.

An input end of the level transmission signal selection module 10 is electrically connected to a start control line or an (N−Y)th-level positive pulse gate drive line. N is an integer greater than or equal to 1, and Y is an integer greater than or equal to 1.

An input end of the pull-up control module 20 is electrically connected to an output end of the level transmission signal selection module 10. A control end of the pull-up control module 20 is electrically connected to a first clock line.

An input end of the pulse quantity reduction module 30 is electrically connected to an output end of the pull-up control module 20. The control end of the pulse quantity reduction module 30 is electrically connected to the reset line.

A control end of the pull-up module 40 is electrically connected to an output end of the pulse quantity reduction module 30. An input end of the pull-up module 40 is electrically connected to a second clock line. An output end of the pull-up module 40 is electrically connected to an Nth-level negative pulse gate drive line. An input end of the first inverting module 50 is electrically connected to the output end of the pull-up control module 20.

A control end of the pull-down module 60 is electrically connected to an output end of the first inverting module 50. An input end of the pull-down module 60 is electrically connected to the high potential line. An output end of the pull-down module 60 is electrically connected to the Nth-level negative pulse gate drive line.

An input end of the second output module 70 is electrically connected to the input end of the pull-up control module 20. An output end of the second output module 70 is electrically connected to the Nth-level positive pulse gate drive line. A quantity of positive pulses output by the Nth-level positive pulse gate drive line in one frame is greater than a quantity of negative pulses output by the Nth-level negative pulse gate drive line in one frame.

In some embodiments, the first output module 46 includes the pull-up module 40 and the pull-down module 60.

It should be noted that the first wire may be the start control line or the (N−Y)th-level positive pulse gate drive line. When N−Y is less than or equal to 0, the first wire is the start control line. The Nth-level positive pulse gate drive line, that is, a second gate drive line, is configured to transmit an Nth-level positive pulse gate drive signal Nout [N], that is, the second gate drive signal. The Nth-level negative pulse gate drive line, that is, a first gate drive line, is configured to transmit an Nth-level negative pulse gate drive signal Pout[N], that is, the first gate drive signal.

In some embodiments, the pulse quantity reduction module 30 includes a transistor T11, one of the source or the drain of the transistor T11 is electrically connected to the output end of the pull-up control module 20, the other of the source or the drain of the transistor T11 is electrically connected to the control end of the pull-up module 40, and a gate of the transistor T11 is electrically connected to the reset line. The transistor T11 is a P-channel thin film transistor. The reset line is the (N−X)th-level positive pulse gate drive line, and X is an integer greater than or equal to 2.

It should be noted that the output end of the pull-up control module 20 is the second node K. The control end of the pull-up module 40 is the third node Q. The other of the source or the drain of the transistor T11 is a node W. The pulse quantity reduction module 30 is configured to reduce a double pulse of the second node K in one frame to a single pulse of the third node Q in one frame. Exemplarily, a first pulse of the second node K in a frame is eliminated, and a second pulse in the same frame retains.

In some embodiments, a ratio of a channel width of the transistor T11 to a channel length of the transistor T11 is greater than or equal to 0.5 and less than or equal to 1.5.

It should be noted that the embodiments of the present disclosure are beneficial to ensure output stability of the Nth-level negative pulse gate drive signal Pout[N], and avoids a coupling drop phenomenon before the negative pulse comes.

In some embodiments, the pulse quantity reduction module 30 also includes a first capacitor C2. One end of the first capacitor C2 is electrically connected to the gate of the transistor T11. The other end of the first capacitor C2 is electrically connected to the other of the source or the drain of the transistor T11.

It should be noted that the embodiments of the present disclosure are beneficial to further improve output stability of the Nth-level negative pulse gate drive signal Pout[N].

In some embodiments, the pull-up module 40 includes a pull-up transistor T6 and a second capacitor C1. A gate of the pull-up transistor T6 is electrically connected to one of the source or the drain of the transistor T11. One of the source or drain of the pull-up transistor T6 is electrically connected to the second clock line. The other of the source or the drain of the pull-up transistor T6 is electrically connected to the Nth-level negative pulse gate drive line. One end of the second capacitor C1 is electrically connected to the gate of the pull-up transistor T6. The other end of the second capacitor C1 is electrically connected to the other of the source or the drain of the pull-up transistor T6. A capacitance ratio of the first capacitor C2 to the second capacitor C1 is greater than or equal to 0.5.

It should be noted that the capacitance ratio of the first capacitor C2 to the second capacitor C1 designed in the embodiments of the present disclosure are beneficial to further ensure output stability of the Nth-level negative pulse gate drive signal Pout[N], and avoids a coupling drop phenomenon before the negative pulse comes.

Exemplarily, capacitance of the first capacitor C2 may be greater than or equal to 50 fF. The capacity of the second capacitor C1 may be greater than or equal to 100 fF.

A ratio of a channel width of a pull-up transistor T6 to a channel length of the pull-up transistor T6 is greater than 30:1, to further ensure output stability of the Nth-level negative pulse gate drive signal Pout[N]. The pull-up transistor T6 may be a P-channel thin film transistor.

In some embodiments, the level transmission signal selection module 10 includes a transistor T13 and a transistor T12. One of the source or the drain of the transistor T13 is electrically connected to the low potential line. The source or the drain of the transistor T13 is electrically connected to the input end of the pull-up control module 20. A first gate of the transistor T13 is electrically connected to the start control line or the (N−Y)th-level positive pulse gate drive line. The first gate of the transistor T13 is electrically connected to a second gate of the transistor T13. The transistor T13 is an N-channel thin film transistor. One of the source or the drain of the transistor T12 is electrically connected to the high potential line. The other of the source or the drain of the transistor T12 is electrically connected to the other of the source or the drain of the transistor T13. A gate of the transistor T12 is electrically connected to the first gate of the transistor T13. The transistor T12 is a P-channel thin film transistor.

It should be noted that the level transmission signal selection module 10 in the embodiments of the present disclosure not only has an inverse phase effect objectively. In other words, an input signal and an output signal have opposite potentials at same time, but also has a function that the Nth-level positive pulse gate drive signal Nout[N] is enabled to as a level transmission signal between the shift registers. Otherwise, level transmission cannot be achieved between the shift registers. As a result, the gate drive circuit fails to provide a corresponding gate drive signal normally.

A ratio of a channel width of the transistor T13 to a channel length of the transistor T13 is greater than 2:1. A ratio of a channel width of the transistor T12 to a channel length of the transistor T12 ranges from 0.5:1 to 3:1.

The high potential line is configured to transmit a high potential signal VGH. The high potential signal VGH may control turn-on of the N-channel thin film transistor or control turn-off of the P-channel thin film transistor. The low potential line is configured to transmit a low potential signal VGL. The low potential signal VGL may control turn-on of the P-channel thin film transistor or cut-off of the N-channel thin film transistor.

In some embodiments, the pull-up control module 20 includes a pull-up control transistor T2. One of the source or the drain of the pull-up control transistor T2 is electrically connected to the output end of the level transmission signal selection module 10. The other of the source or the drain of the pull-up control transistor T2 is electrically connected to the input end of the pulse quantity reduction module 30. A gate of the pull-up control transistor T2 is electrically connected to the first clock line.

It should be noted that the pull-up control transistor T2 may be a P-channel thin film transistor. A ratio of a channel width of the pull-up control transistor T2 to a channel length of the pull-up control transistor T2 ranges from 0.5:1 to 3:1.

In some embodiments, the first inverting module 50 includes a transistor T3 and a transistor T1. One of the source or the drain of the transistor T3 is electrically connected to the high potential line. The other of the source or the drain of transistor T3 is electrically connected to one of the source or the drain of transistor T1 and the control end of pull-down module 60. The other of the source or the drain of transistor T1 is electrically connected to the low potential line. The output end of pull-up control module 20 is electrically connected to a gate of transistor T3, a first gate of transistor T1, and a second gate of transistor T1.

It should be noted that the transistor T3 is a P-channel thin film transistor. The transistor T1 is a dual-gate N-channel thin film transistor. In this way, dynamic performance of the transistor T3 and the transistor T1 can be improved, and then dynamic performance of the first inverting module 50 can be improved.

A ratio of a channel width of the transistor T3 to a channel length of the transistor T3 ranges from 0.5:1 to 3:1. A ratio of a channel width of the transistor T1 to a channel length of the transistor T1 is greater than or equal to 2:1.

In some embodiments, the pull-down module 60 includes a pull-down transistor T7. One of the source or the drain of the pull-down transistor T7 is electrically connected to the high potential line. The other of the source or the drain of the pull-down transistor T7 is electrically connected to the Nth-level negative pulse gate drive line. A gate of the pull-down transistor T7 is electrically connected to the output end of the first inverting module 50, that is, the fourth node P.

It should be noted that the pull-down transistor T7 may be a P-channel thin film transistor. Under a combined action of the pull-down module 60 and the pull-up module 40, a needed Nth-level negative pulse gate drive signal Pout[N] can be modulated.

A ratio of a channel width of the pull-down transistor T7 to a channel length of the pull-down transistor T7 is greater than or equal to 30:1.

In some embodiments, the first transistor T9 is a P-channel thin film transistor. The second transistor T10 is a dual-gate N-channel thin film transistor. In this way, dynamic performance of the first transistor T9 and the second transistor T10 can be improved, and the dynamic performance of the second output module 70 can be improved.

A ratio of a channel width of the first transistor T9 to a channel length of the first transistor T9 is greater than or equal to 30:1. A ratio of a channel width of the second transistor T10 to a channel length of the second transistor T10 is greater than or equal to 30:1.

In some embodiments, an Nth-level shift register also includes the leakage prevention module 80. One end of the leakage prevention module 80 is electrically connected to the output end of the pulse quantity reduction module 30. The other of the leakage prevention module 80 is electrically connected to the control end of the pull-up module 40. A control end of the leakage prevention module 80 is electrically connected to the low potential line.

It should be noted that the leakage prevention module 80 may be configured to prevent charge of the third node Q from flowing to the node W, which is beneficial to maintain potential stability of the third node Q.

In some embodiments, the leakage prevention module 80 includes a leakage prevention transistor T8. One of the source or the drain electrodes of the leakage prevention transistor T8 is electrically connected to an output end of the pulse quantity reduction module 30. The other of the source or the drain of the leakage prevention transistor T8 is electrically connected to the control end of the pull-up module 40. A gate of the leakage prevention transistor T8 is electrically connected to the low potential line.

It should be noted that the leakage prevention transistor T8 may be a P-channel thin film transistor; and may also be an N-channel thin film transistor. In this case, the gate of the leakage prevention transistor T8 needs to be electrically connected to a high potential line.

A ratio of a channel width of the leakage prevention transistor T8 to a channel length of the leakage prevention transistor T8 ranges from 0.5:1 to 3:1.

In some embodiments, the Nth-level shift register also includes the feedback module 90. The feedback module 90 includes a transistor T4 and a transistor T5. One of the source or the drain of the transistor T4 is electrically connected to the output end of the pull-up control module 20. A gate of the transistor T4 is electrically connected to a second clock line. The other of the source or the drain of the transistor T4 is electrically connected to one of the source or the drain of the transistor T5. The other of the source or the drain of the transistor T5 is electrically connected to a high potential line. A gate of the transistor T5 is electrically connected to the output end of the first inverting module 50.

A ratio of a channel width of the transistor T4 to a channel length of the transistor T4 ranges from 0.5:1 to 3:1. A ratio of a channel width of the transistor T5 to a channel length of the transistor T5 ranges from 0.5:1 to 3:1.

It should be noted that the feedback module 90 may maintain the second node K at a high potential based on a potential of the fourth node P and a potential of the second clock line. In other words, when the fourth node P is at a low potential and a second clock signal CK is at a low potential, the high potential line may control a potential of the second node K to a potential of the high potential signal VGH.

It should be noted that the Nth-level positive pulse gate drive line is configured to transmit the Nth-level positive pulse gate drive signal Nout[N]. The Nth-level negative pulse gate drive line is configured to transmit the Nth-level negative pulse gate drive signal Pout[N]. The first clock line is configured to transmit a first clock signal XCK. The second clock line is configured to transmit the second clock signal CK. The start control line is configured to transmit a start control signal STV. The (N−Y)th-level positive pulse gate drive line is configured to transmit an (N−Y)th-level positive pulse gate drive signal Nout[N−Y]. The (N−X)th-level positive pulse gate drive line is configured to transmit the (N−X)th-level positive pulse gate drive signal Nout[N−X]. The reset line is configured to transmit a reset signal RST.

Figure 7:
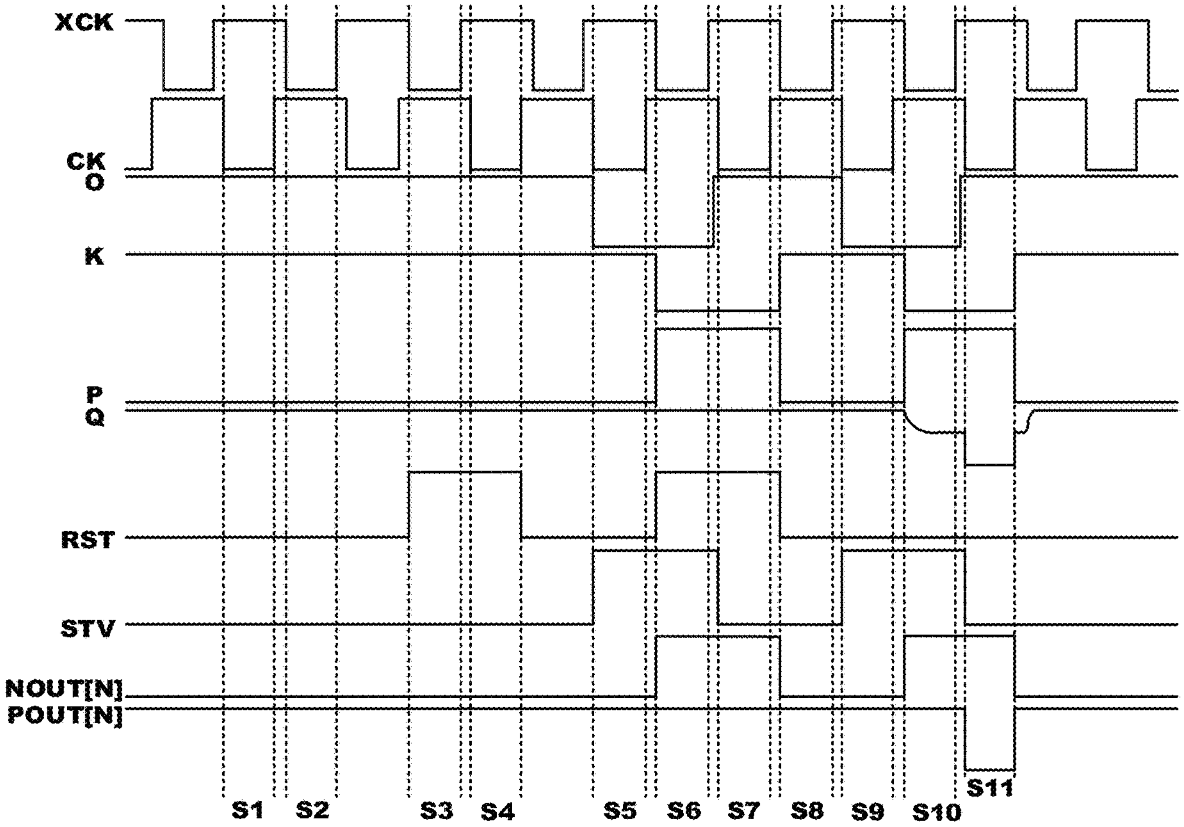
FIG. 7 is a schematic diagram of timing of the gate drive circuit shown in FIG. 3.
Figure 8:
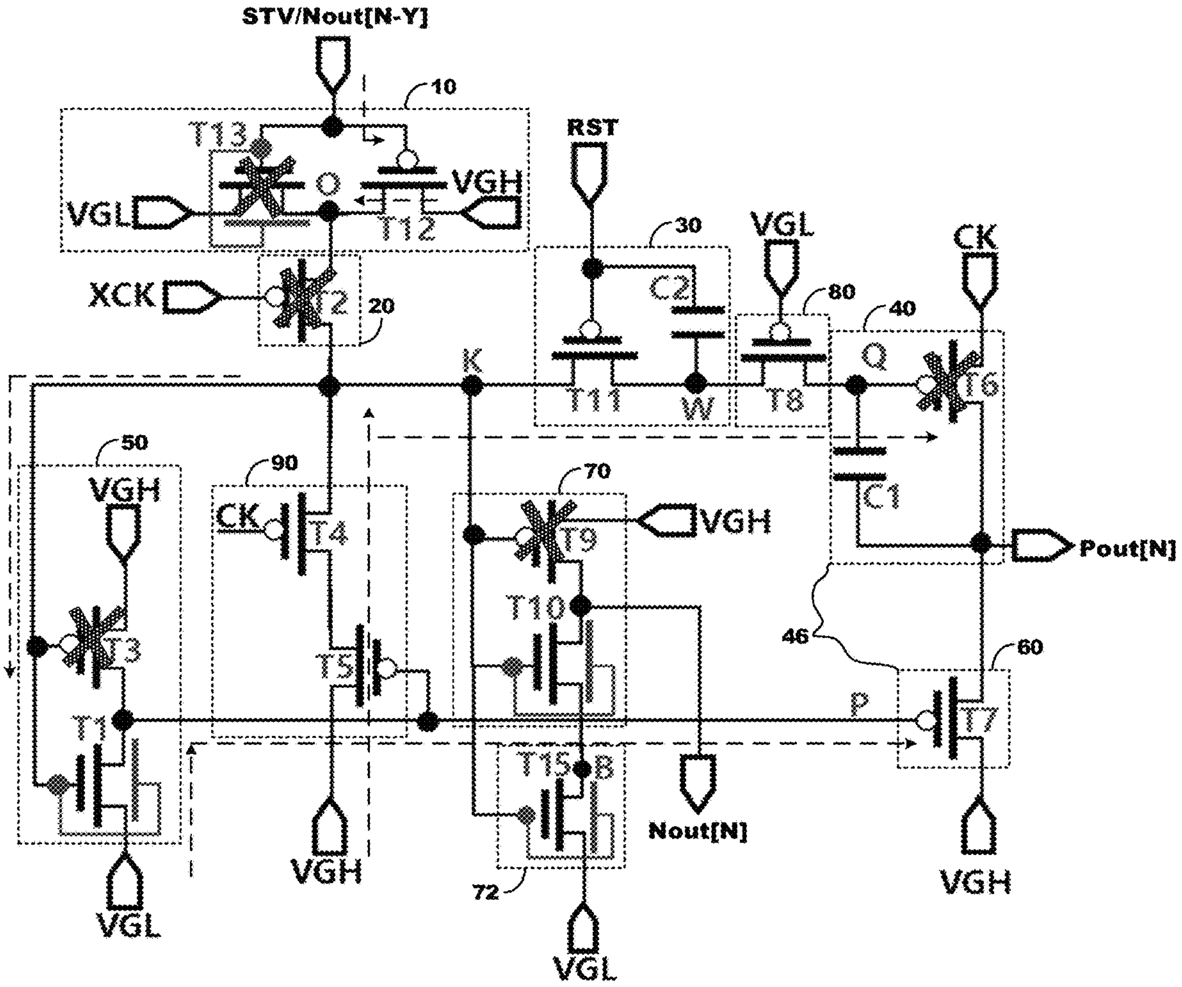
FIG. 8 is a schematic diagram of the gate drive circuit shown in FIG. 3 in a first stage state in FIG. 7.

A working process of the above shift registers in one frame may include the following stages as shown in FIG. 7:

A first stage S1: as shown in FIG. 7 and FIG. 8, the start control signal STV, the reset signal RST, and the second clock signal CK are all at a low potential; the first clock signal XCK is at a high potential. The first node O, the second node K, and the third node Q are all at a high potential. The fourth node P is at a low potential. The Nth-level positive pulse gate drive signal Nout[N] is at a low potential. The Nth-level negative pulse gate drive signal Pout[N] is at a high potential.

Figure 9:
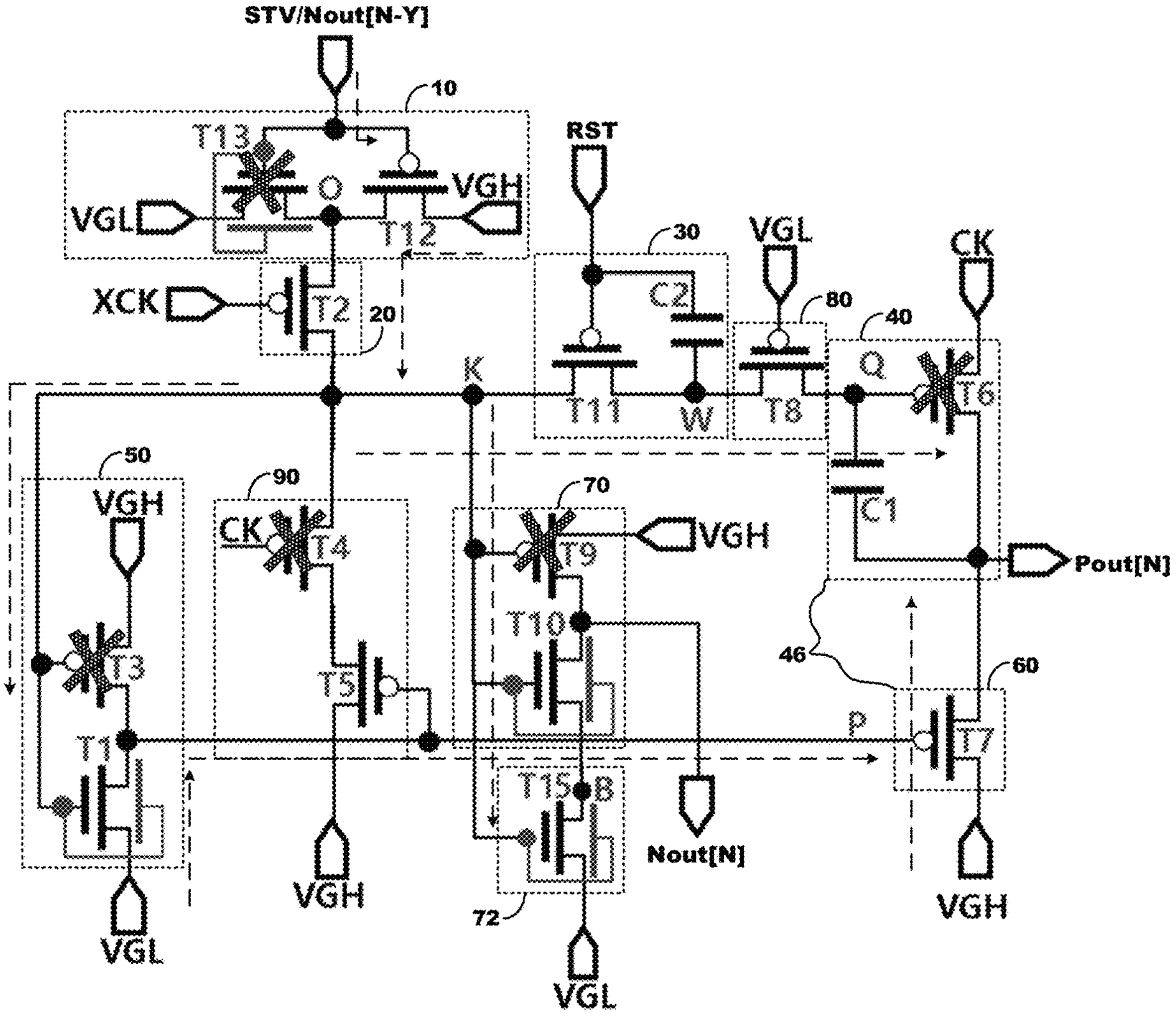
FIG. 9 is a schematic diagram of the gate drive circuit shown in FIG. 3 in a second stage state in FIG. 7.

A second stage S2: as shown in FIG. 7 and FIG. 9, the start control signal STV, the reset signal RST, and the first clock signal XCK are all at a low potential. The second clock signal CK is at a high potential. The first node O, the second node K, and the third node Q are all at a high potential. The fourth node P is at a low potential. The Nth-level positive pulse gate drive signal Nout[N] is at a low potential. The Nth-level negative pulse gate drive signal Pout[N] is at a high potential.

Figure 10:
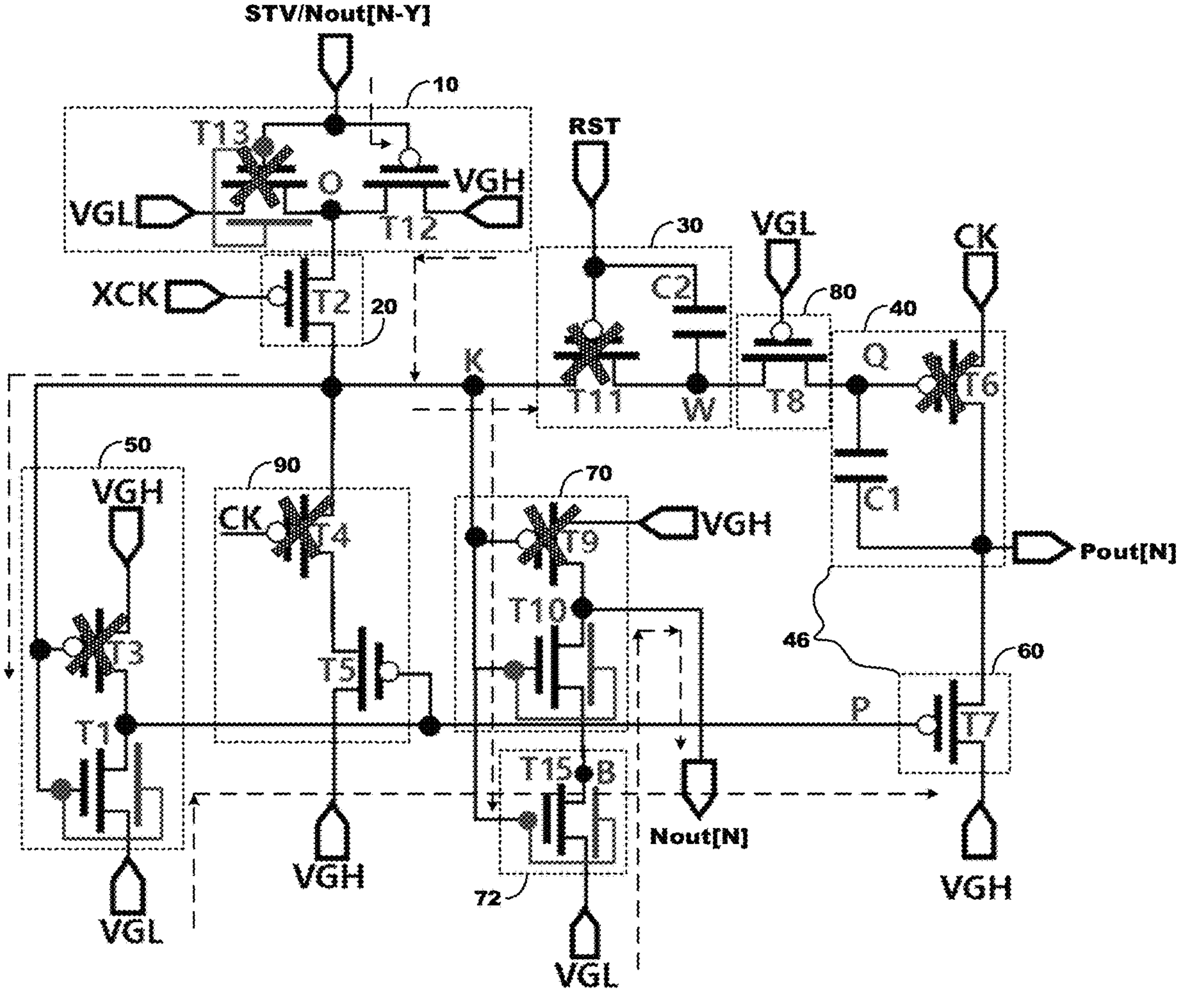
FIG. 10 is a schematic diagram of the gate drive circuit shown in FIG. 3 in a third stage state in FIG. 7.

A third stage S3: as shown in FIG. 7 and FIG. 10, the start control signal STV and the first clock signal XCK are both at a low potential. The reset signal RST and the second clock signal CK are both at a high potential. The first node O, the second node K, and the third node Q are all at a high potential. The fourth node P is at a low potential. The Nth-level positive pulse gate drive signal Nout[N] is at a low potential. The Nth-level negative pulse gate drive signal Pout[N] is at a high potential.

Figure 11:
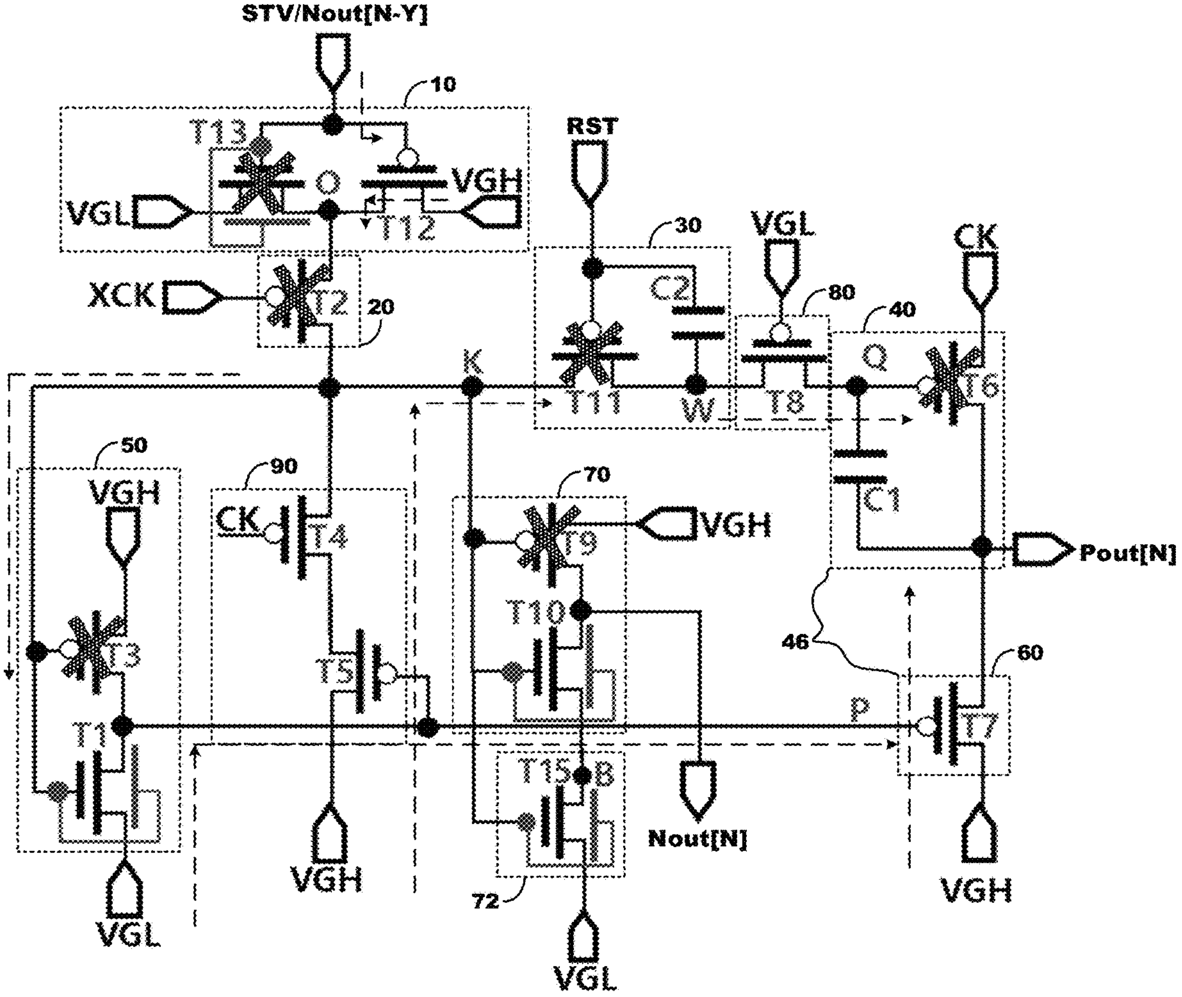
FIG. 11 is a schematic diagram of the gate drive circuit shown in FIG. 3 in a fourth stage state in FIG. 7.

A fourth stage S4: as shown in FIG. 7 and FIG. 11, the start control signal STV and the second clock signal CK are both at a low potential. The reset signal RST and the first clock signal XCK are both at a high potential. The first node O, the second node K, and the third node Q are all at a high potential. The fourth node P is at a low potential. The Nth-level positive pulse gate drive signal Nout[N] is at a low potential. The Nth-level negative pulse gate drive signal Pout[N] is at a high potential.

Figure 12:
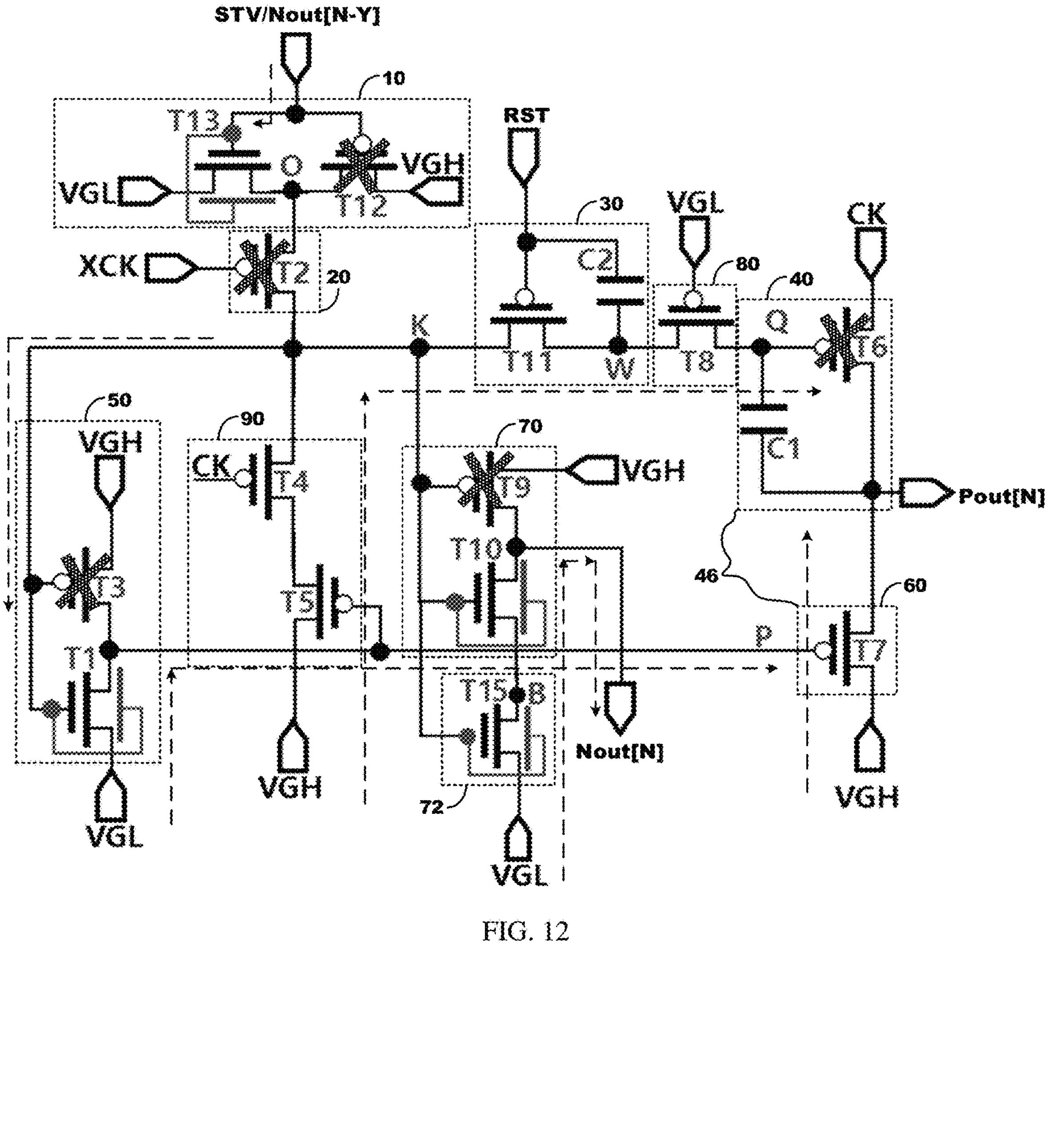
FIG. 12 is a schematic diagram of the gate drive circuit shown in FIG. 3 in a fifth stage state in FIG. 7.

A fifth stage S5: as shown in FIG. 7 and FIG. 12, the reset signal RST and the second clock signal CK are both at a low potential. The start control signal STV and the first clock signal XCK are both at a high potential. The second node K and the third node Q are both at a high potential. The first node O and the fourth node P are both at a low potential. The Nth-level positive pulse gate drive signal Nout[N] is at a low potential. The Nth-level negative pulse gate drive signal Pout[N] is at a high potential.

Figure 13:
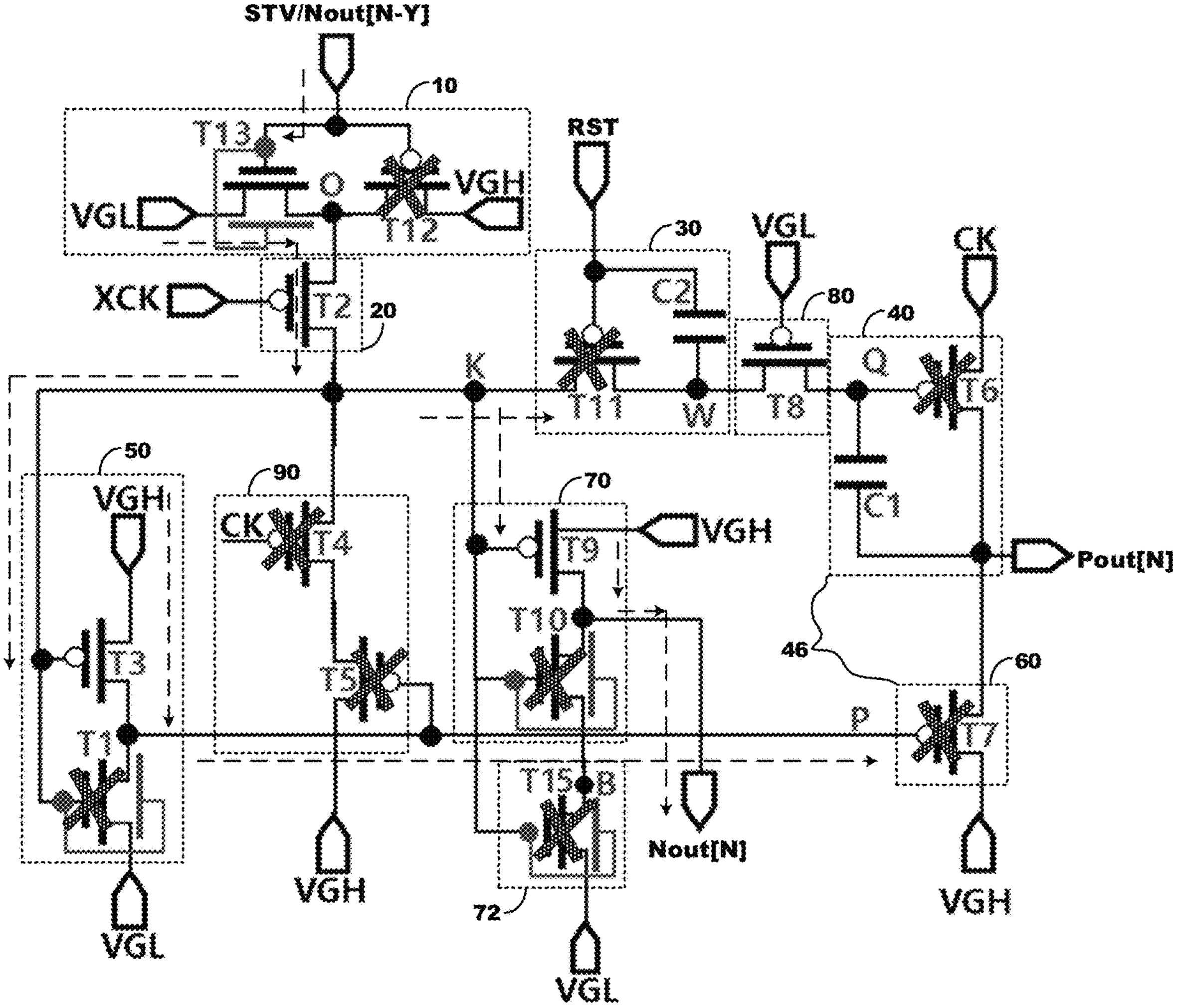
FIG. 13 is a schematic diagram of the gate drive circuit shown in FIG. 3 in a sixth stage state in FIG. 7.

A sixth stage S6: as shown in FIG. 7 and FIG. 13, the first clock signal XCK is at a low potential. The reset signal RST, the start control signal STV, and the second clock signal CK are all at a high potential. The second node K and the first node O are both at a low potential. The third node Q and the fourth node P are both at a high potential. The Nth-level positive pulse gate drive signal Nout[N] is at a high potential. The Nth-level negative pulse gate drive signal Pout[N] is at a high potential.

Figure 14:
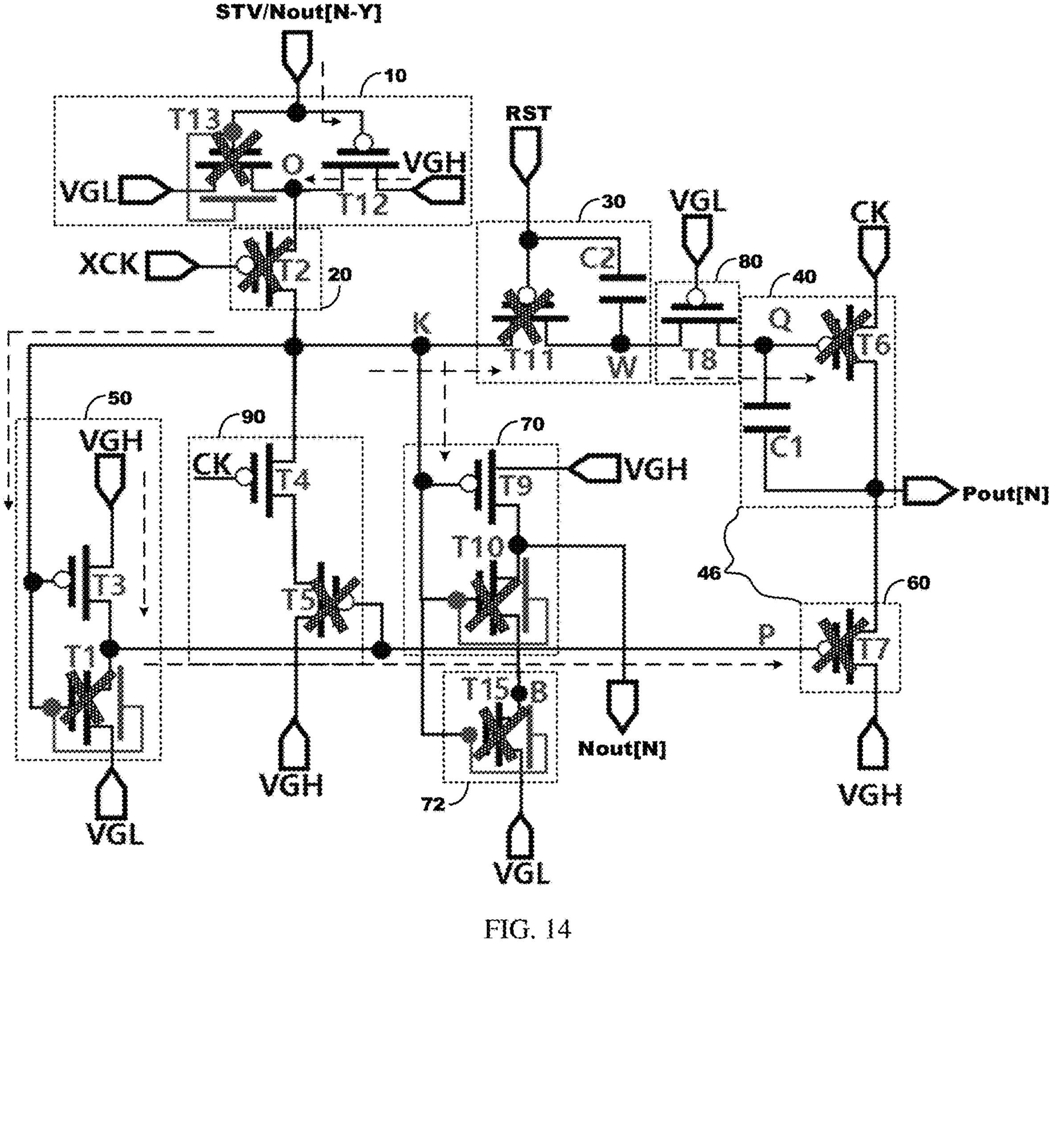
FIG. 14 is a schematic diagram of the gate drive circuit shown in FIG. 3 in a seventh stage state in FIG. 7.

A seventh stage S7: as shown in FIG. 7 and FIG. 14, the start control signal STV and the second clock signal CK are both at a low potential. The reset signal RST and the first clock signal XCK are both at a high potential. The second node K is at a low potential. The first node O, the third node Q, and the fourth node P are all at a high potential. The Nth-level positive pulse gate drive signal Nout[N] is at a high potential. The Nth-level negative pulse gate drive signal Pout[N] is at a high potential.

Figure 15:
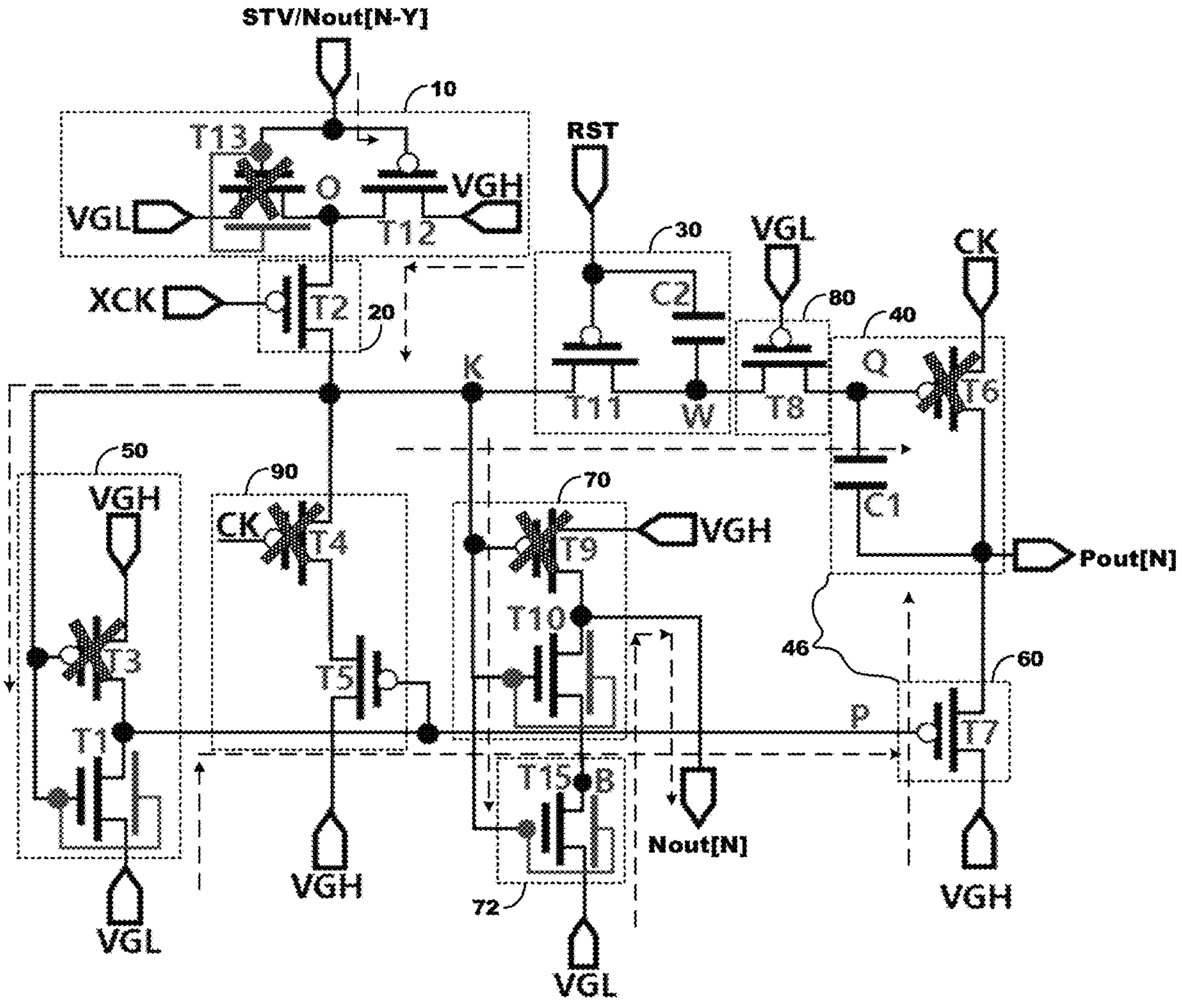
FIG. 15 is a schematic diagram of the gate drive circuit shown in FIG. 3 in an eighth stage state in FIG. 7.

An eighth stage S8: as shown in FIG. 7 and FIG. 15, the reset signal RST, the start control signal STV, and the first clock signal XCK are all at a low potential. The second clock signal CK is at a high potential. The fourth node P is at a low potential. The third node Q and the second node K are both at a high potential. The Nth-level positive pulse gate drive signal Nout[N] is at a low potential. The Nth-level negative pulse gate drive signal Pout[N] is at a high potential.

Figure 16:
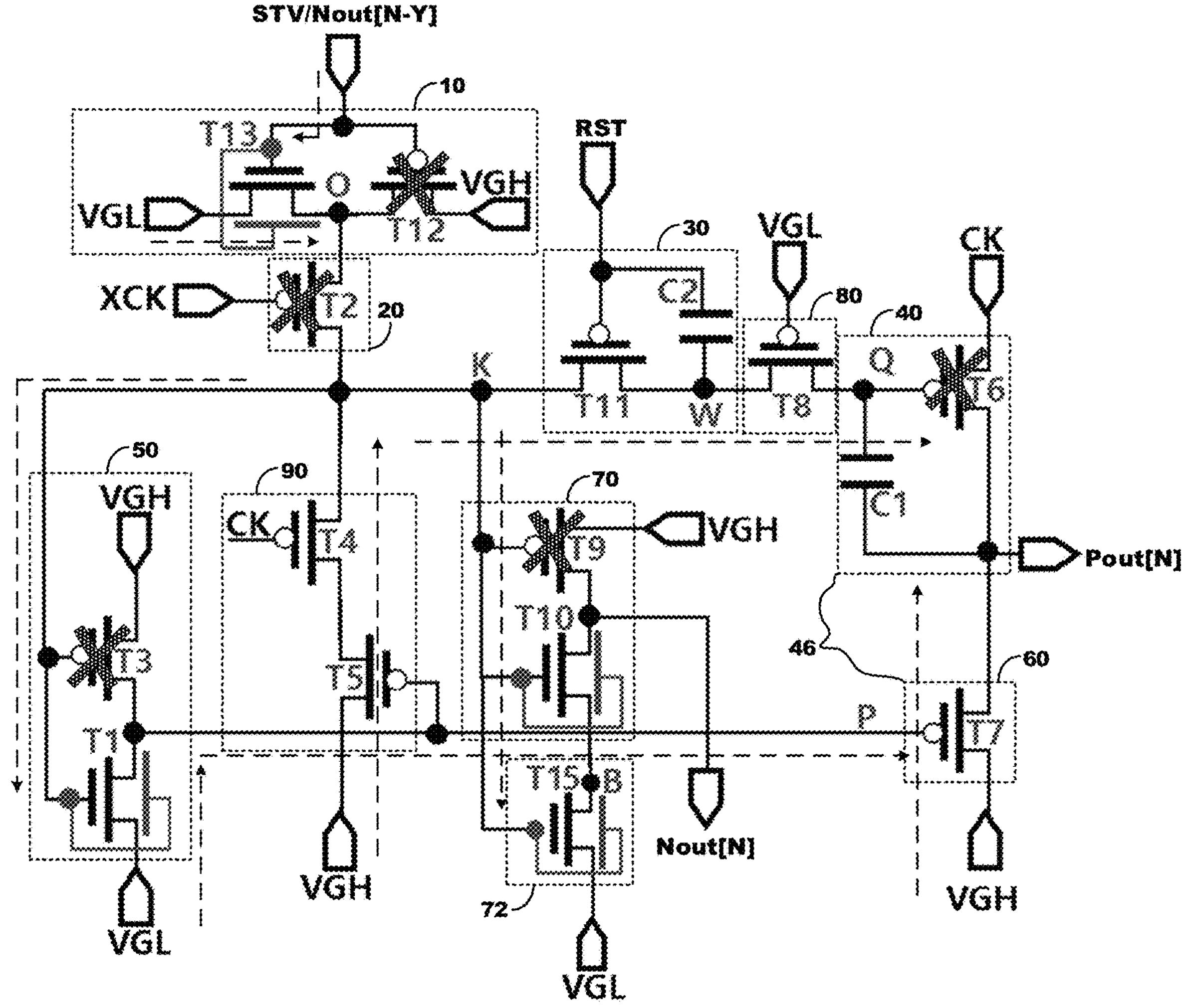
FIG. 16 is a schematic diagram of the gate drive circuit shown in FIG. 3 in a ninth stage state in FIG. 7.

A ninth stage S9: as shown in FIG. 7 and FIG. 16, the reset signal RST and the second clock signal CK are both at a low potential. The start control signal STV and the first clock signal XCK are at a high potential; the first node O and the fourth node P are at a low potential. The third node Q and the second node K are both at high potential. The Nth-level positive pulse gate drive signal Nout[N] is at a low potential. The Nth-level negative pulse gate drive signal Pout[N] is at a high potential.

Figure 17:
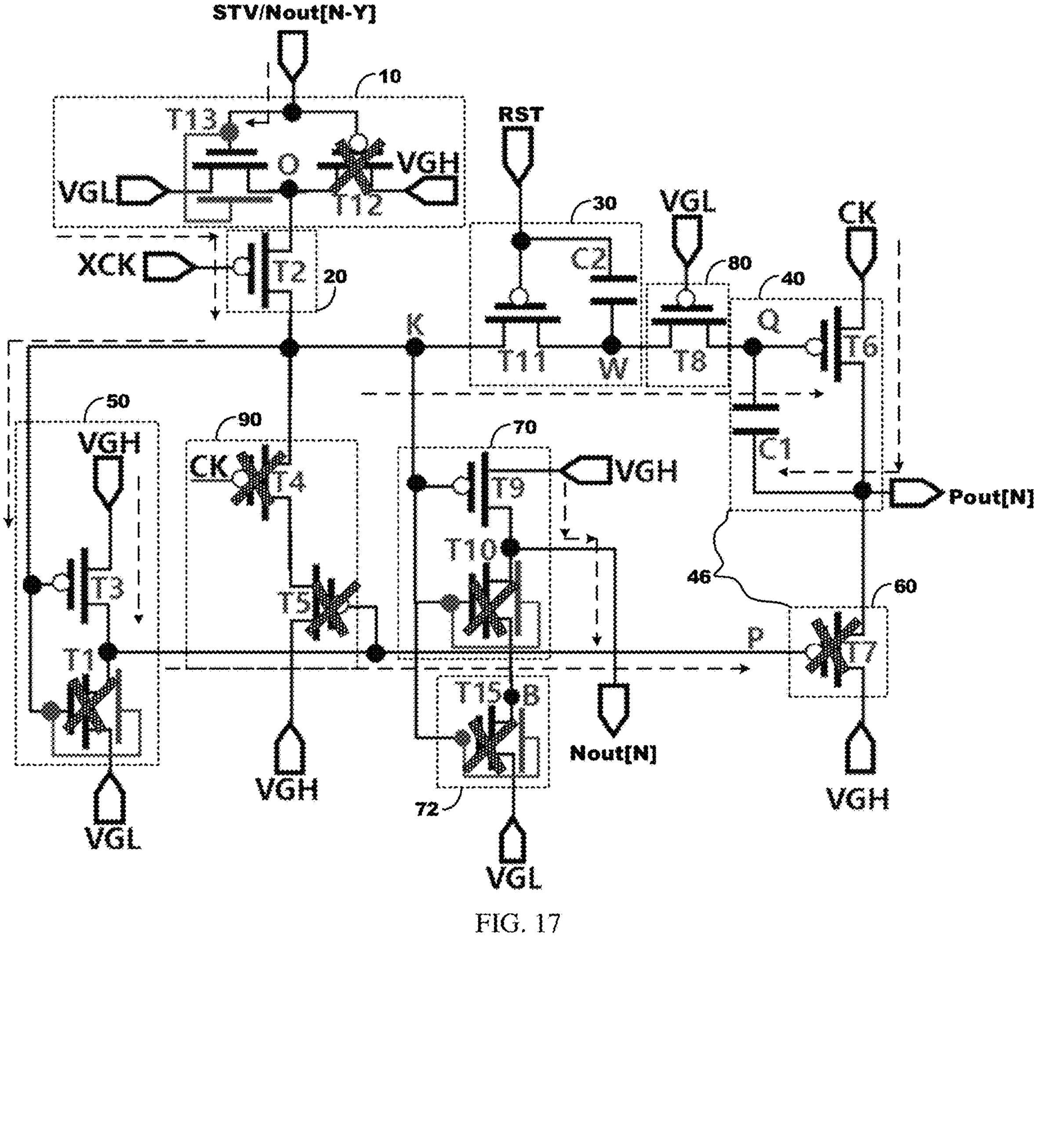
FIG. 17 is a schematic diagram of the gate drive circuit shown in FIG. 3 in a tenth stage state in FIG. 7.

A tenth stage S10: as shown in FIG. 7 and FIG. 17, the reset signal RST and the first clock signal XCK are both at a low potential. The start control signal STV and the second clock signal CK are at a high potential. The first node O, the third node Q, and the second node K is at a low potential. The fourth node P is at a high potential. The Nth-level positive pulse gate drive signal Nout[N] is at a high potential. The Nth-level negative pulse gate drive signal Pout[N] is at a high potential.

Figure 18:
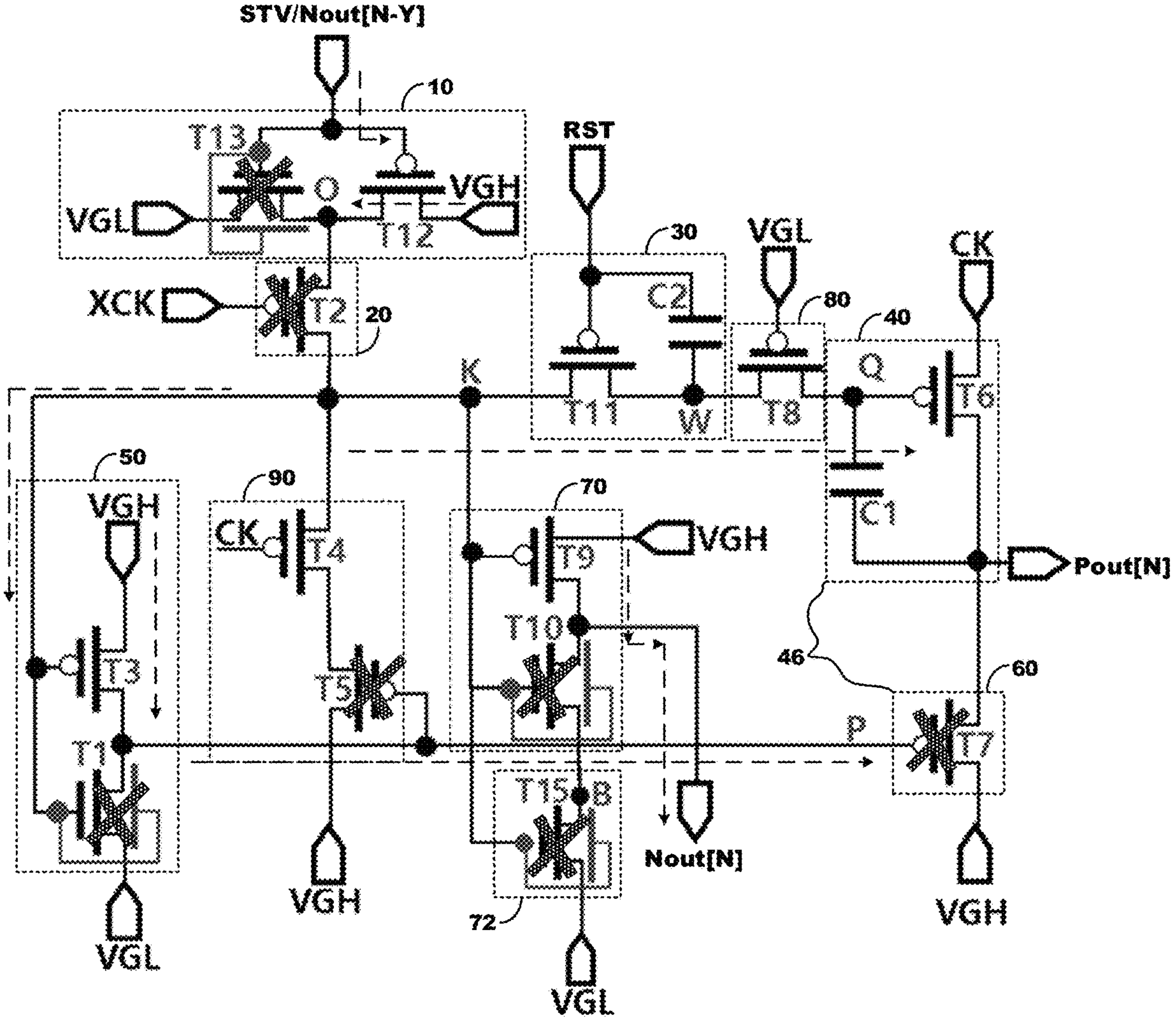
FIG. 18 is a schematic diagram of the gate drive circuit shown in FIG. 3 in an eleventh stage state in FIG. 7.

An eleventh stage S11: as shown in FIG. 7 and FIG. 18, the start control signal STV, the reset signal RST, and the second clock signal CK are all at a low potential. The first clock signal XCK is at a high potential. The third node Q and the second node K are at a low potential. The first node O and the fourth node P are at a high potential. The Nth-level positive pulse gate drive signal Nout[N] is at high potential. The Nth-level negative pulse gate drive signal Pout[N] is at a low potential.

It should be noted that marks "X" in FIGS. 8 to 18 indicate that the transistors covered by "X" are in an OFF state, and the transistors not covered by the "X" are in an ON state. The dashed line arrows in FIGS. 8 to 18 show a direction of current.

It can be learned from FIG. 7 that the Nth-level positive pulse gate drive signal Nout[N] has a first positive pulse and a second positive pulse in one frame; and the Nth-level negative pulse gate drive signal Pout[N] has a first negative pulse in one frame.

In one frame, duration of the second positive pulse is longer than duration of the first negative pulse, and the duration of the first negative pulse is within the duration of the second positive pulse.

Exemplarily, falling edges of the second positive pulse is at a same moment as rising edges of the first negative pulse.

In some embodiments, a phase difference between the first clock signal XCK and the second clock signal CK is 180°. One falling edge of the second clock signal CK, the falling edges of the second positive pulse, and rising edges of the first negative pulse are all within duration of a positive pulse of the first clock signal XCK.

Figure 19:
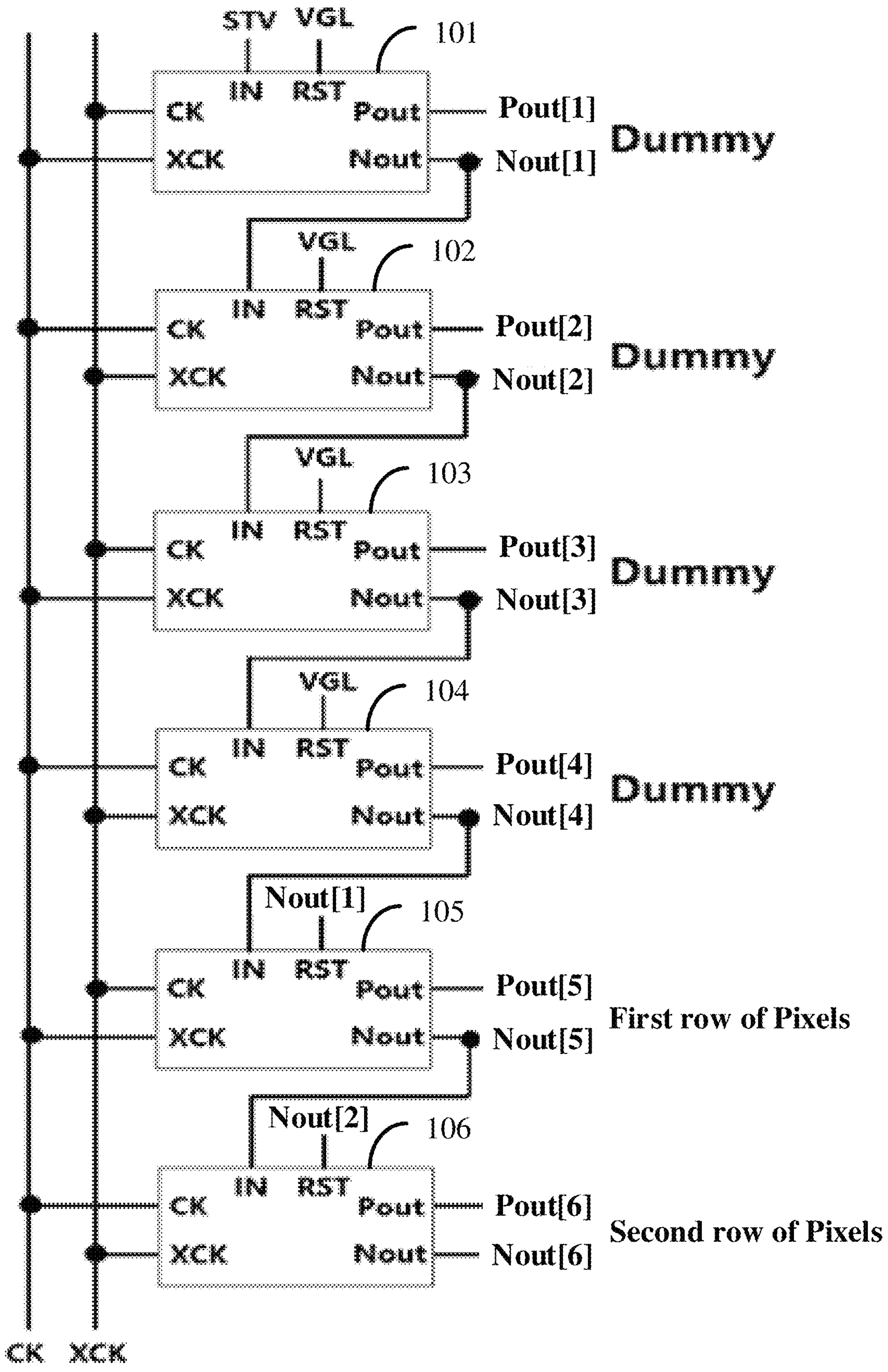
FIG. 19 is a schematic diagram of a structure of a cascade connection between different shift registers in the gate drive circuit shown in FIG. 3.

FIG. 19 is a schematic diagram of a structure of a cascade connection between different shift registers in the gate drive circuit shown in FIG. 3. A first shift register 101, a second shift register 102, a third shift register 103, a fourth shift register 104, a fifth shift register 105, a sixth shift register 106, and the like are disposed in sequence from top to bottom. The first clock line is electrically connected to each shift register separately. The second clock line is also electrically connected to each shift register separately.

The first shift register 101 separately outputs a corresponding first-level negative pulse gate drive signal Pout[1] and first-level positive pulse gate drive signal Nout[1] by a first-level negative pulse gate drive line and a first-level positive pulse gate drive line.

The second shift register 102 separately outputs a corresponding second-level negative pulse gate drive signal Pout [2] and second-level positive pulse gate drive signal Nout[2] by a second-level negative pulse gate drive line and a second-level positive pulse gate drive line.

The third shift register 103 separately outputs a corresponding third-level negative pulse gate drive signal Pout[3] and third-level positive pulse gate drive signal Nout3] by a third-level negative pulse gate drive line and a third-level positive pulse gate drive line.

The fourth shift register 104 separately outputs a corresponding fourth-level negative pulse gate drive signal Pout [4] and fourth-level positive pulse gate drive signal Nout4] by a fourth-level negative pulse gate drive line and a fourth-level positive pulse gate drive line.

The fifth shift register 105 separately outputs a corresponding fifth-level negative pulse gate drive signal Pout[5] and fifth-level positive pulse gate drive signal Nout5] by a fifth-level negative pulse gate drive line and a fifth-level positive pulse gate drive line.

The sixth shift register 106 separately outputs a corresponding sixth-level negative pulse gate drive signal Pout[6] and sixth-level positive pulse gate drive signal Nout6] by a sixth-level negative pulse gate drive line and sixth-level positive pulse gate drive line. Other shift registers may be deduced in sequence.

An input end (IN) of the level transmission signal selection module 10 of the first shift register 101 is electrically connected to the start control line to receive the start control signal STV. Each input end (IN) of the level transmission signal selection module 10 of other shift registers receives an upper-level positive pulse gate drive signal. For example, an input end (IN) of the level transmission signal selection module 10 of the second shift register 102 receives the first-level positive pulse gate drive signal Nout[1]. An input end (IN) of the level transmission signal selection module 10 of the third shift register 103 receives the second-level positive pulse gate drive signal Nout[2]. An input end (IN) of the level transmission signal selection module 10 of the fourth shift register 104 receives the third-level positive pulse gate drive signal Nout[3]. An input end (IN) of the level transmission signal selection module 10 of the fifth shift register 105 receives the fourth-level positive pulse gate drive signal Nout[4]. An input end (IN) of the level transmission signal selection module 10 of the sixth shift register 106 receives the fifth-level positive pulse gate drive signal Nout[5]. Others may be deduced in sequence.

A control end of the pulse quantity reduction module 30 of the fifth shift register 105 receives the first-level positive pulse gate drive signal Nout[1]. A control end of the pulse quantity reduction module 30 of the sixth shift register 106 receives the second-level positive pulse gate drive signal Nout[2]. Others may be deduced in sequence. X may also be 3, 4, 5, 6, 7, or the like. Here, an example that X is equal to 4 is used for description.

Each output end of the first shift register 101 to the fourth shift register 104 is not configured to drive a corresponding pixel circuit for display, but is connected to a dummy pixel (Dummy) or is floating. Output ends of the fifth shift register 105 are electrically connected to a first row of pixel circuits (Pixel). Output ends of the sixth shift register 106 are electrically connected to a second row of pixel circuits (Pixel). Others may be deduced in sequence.

It should be noted that because output ends of some shift registers are connected to dummy pixels or are floating, output ends of the Nth-level shift register are not connected to an Nth row of pixel circuits, but a quantity of rows of pixel circuits need to be determined based on a quantity of shift registers that are connected to dummy pixels or are floating.

Figure 20:
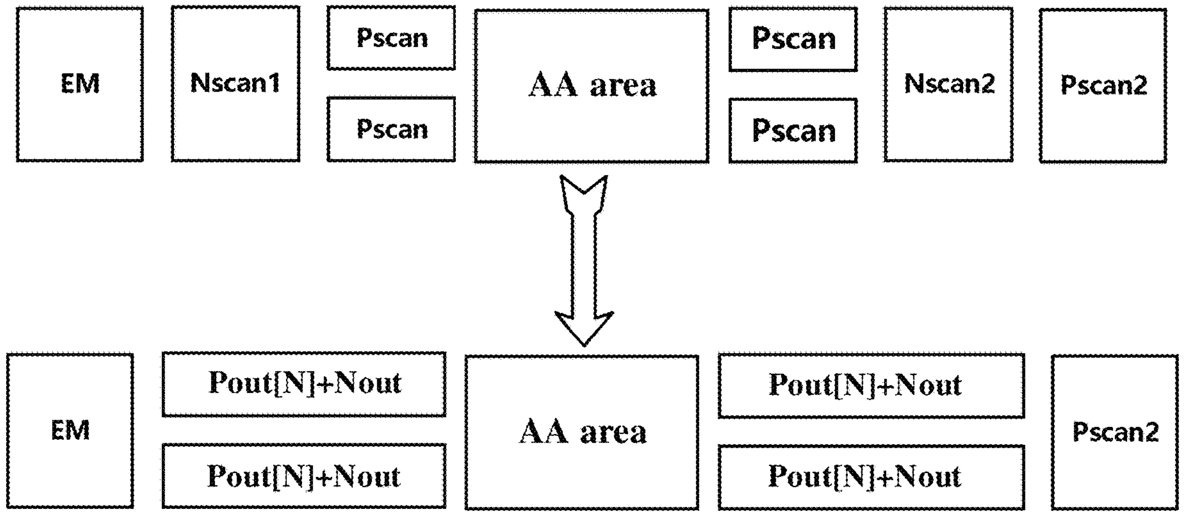
FIG. 20 is a schematic diagram of a structure of a display panel according to some embodiments of the present disclosure.

The upper section in FIG. 20 is a schematic diagram of a structure of a display panel in the conventional technology. Each gate drive circuit for providing a light-emitting control signal EM, a gate drive signal Nscan1, and gate drive signals Pscan is separately arranged on a left side (a non-display area or frame area) of a display area (AA area), and each gate drive circuit for providing gate drive signals Pscan, a gate drive signal Nscan2, and a gate drive signal Pscan2 is separately arranged on a right side (a non-display area or frame area) of a display area (AA area).

Each gate drive signal Pscan drives a row of pixel circuits. Working modes of the gate drive signal Nscan1 and the gate drive signal Nscan2 are also same as the gate drive signal Pscan, but one gate drive signal Nscan1/gate drive signal Nscan2 needs to drive two rows of pixel circuits. In actual work, to achieve a narrower frame, a gate drive circuit for outputting the gate drive signal Nscan1 and a gate drive circuit for outputting the gate drive signal Nscan2 are both set to unilateral drive. However, in this way, driving capabilities of the two gate drive circuits are decreased and power consumption is increased.

In view of this, in the embodiments of the present disclosure, the gate drive circuit shown in FIG. 3 is set to bilateral drive as shown in the lower section of FIG. 20. To be specific, one gate drive circuit in FIG. 3 is respectively provided on both sides of an AA area, to simultaneously input corresponding gate drive signals from both ends of each gate drive line. In this way, the driving capabilities of the Nth-level negative pulse gate drive signal Pout[N] and the positive pulse gate drive signal Nout is not only improved, but also power consumption is reduced and space occupied by the frame is reduced, facilitating development of a frame solution.

The positive pulse gate drive signal Nout includes an Nth-level positive pulse gate drive signal Nout[N] and an (N−L)th-level positive pulse gate drive signal Nout[N−L]. L may be an integer greater than or equal to 1, for example, may be 2, 3, 4, 5, 6, . . . , and the like.

In some embodiments, a display panel is provided. The display panel includes a gate drive circuit and a plurality of pixel circuits in at least one of the above embodiments. A row of pixel circuits are electrically connected to the Nth-level positive pulse gate drive line and the Nth-level negative pulse gate drive line.

It may be understood that because the display panel provided in the embodiments of the present disclosure includes the gate drive circuit in at least one of the above embodiments, the voltage boosting module 72 can also be connected in series between the second electrode of the second transistor T10 and the low potential line. In the case that the first transistor T9 is turned on, the potential of the second electrode of the second transistor T10 can be increased, the on-state current of the second transistor T10 can be reduced, and the pulse amplitude of the second gate drive signal can be increased and stabilized. In addition, by increasing the potential of the second electrode of the second transistor T10, negative bias of a threshold voltage of the second transistor T10 can be alleviated, so that a negative bias range of the threshold voltage of the second transistor T10 can be increased, abnormalities in the second gate drive signal can be avoided, thereby improving reliability of the gate drive circuit or the display panel.

In addition, the second gate drive signal with more pulses may be output by the level transmission signal selection module 10, the pull-up control module 20, and the second output module 70. In addition, the second gate drive signal may be selected as a level transmission signal between different shift registers. Furthermore, the first gate drive signal with fewer pulses may be output by the level transmission signal selection module 10, the pull-up control module 20, the pulse quantity reduction module 30, the first inverting module 50, and the first output module 46. This can meet needs of a corresponding pixel circuit for the pulses of the gate drive signals in one frame in terms of time, quantity, and the like, thereby driving the pixel circuit to achieve high definition display.

Figure 21:
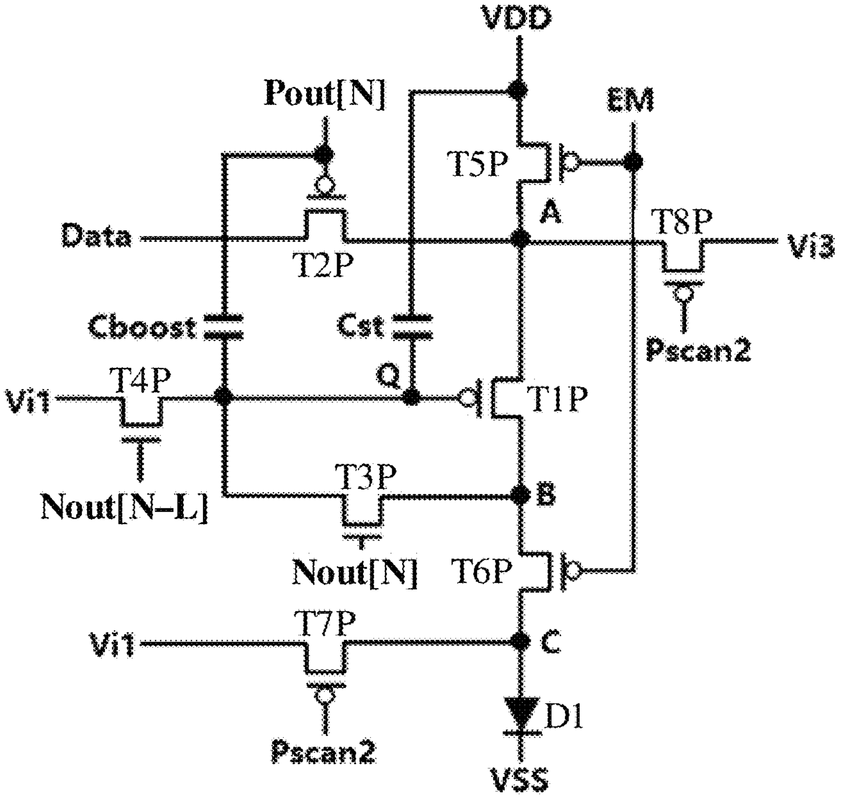
FIG. 21 is a schematic diagram of a structure of a pixel circuit in the display panel shown in FIG. 20.

FIG. 21 is a schematic diagram of a structure of a pixel circuit in the display panel shown in FIG. 20. It may be understood that the gate drive circuit shown in FIG. 3 may be a corresponding Nth-level positive pulse gate drive signal Nout[N]. (N−L)th-level positive pulse gate drive signal Nout[N−L], and Nth-level negative pulse gate drive signal Pout[N] provided by the pixel circuit shown in FIG. 21.

The pixel circuit shown in FIG. 21 may include at least one of a write transistor T2P, a drive transistor T1P, a first light-emitting control transistor T5P, a second light-emitting control transistor T6P, a first initialization transistor T4P, a second initialization transistor T7P, a third initialization transistor T8P, a compensation transistor T3P, a light-emitting device D1, a storage capacitor Cst, or a bootstrap capacitor Cboost.

A first power line is electrically connected to a first electrode of the first light-emitting control transistor T5P and an end of the storage capacitor Cst. A second electrode of the first light-emitting control transistor T5P is electrically connected to a first electrode of the drive transistor T1P and a first electrode of the write transistor T2P. A second electrode of the drive transistor T1P is electrically connected to a first electrode of the compensation transistor T3P and a first electrode of the second light-emitting control transistor T6P. A second electrode of the second light-emitting control transistor T6P is electrically connected to a first electrode of the second initialization transistor T7P and an anode of the light-emitting device D1. A cathode of the light-emitting device D1 is electrically connected to a second power line. A light-emitting control line is electrically connected to a gate of the first light-emitting control transistor T5P and a gate of the second light-emitting control transistor T6P. A second electrode of the write transistor T2P is electrically connected to a data line, and a gate of the write transistor T2P is electrically connected to an Nth-level negative pulse gate drive line (a first gate drive line) and one end of the bootstrap capacitor Cboost. A second electrode of the second initialization transistor T7P is electrically connected to a second initialization line, and a gate of the second initialization transistor T7P is electrically connected to a third gate drive line. A second electrode of the compensation transistor T3P is electrically connected to the gate of the drive transistor T1P, and a gate of the compensation transistor T3P is electrically connected to an Nth-level positive pulse gate drive line (a second gate drive line). The gate of the drive transistor T1P is electrically connected to the other end of the storage capacitor Cst, the other end of the bootstrap capacitor Cboost, and a first electrode of the first initialization transistor T4P. A second electrode of the first initialization transistor T4P is electrically connected to a first initialization line, and a gate of the first initialization transistor T4P is electrically connected to an (N−L)th-level positive pulse gate drive line (a second gate drive line). A first electrode of the third initialization transistor T8P is electrically connected to the first electrode of the drive transistor T1P. A second electrode of the third initialization transistor T8P is electrically connected to a third initialization line. A gate of the third initialization transistor T8P and the gate of the second initialization transistor T7P share the third gate drive line.

It should be noted that, the second initialization line may also be replaced by the first initialization line. In this way, one trace required for the pixel circuit may be reduced to increase the density of pixel circuits in the display panel.

The first electrode may be one of the source or the drain, and the second electrode may be the other of a source or a drain. For example, when the first electrode is a source, the second electrode is a drain. Optionally, when the first electrode is a drain, the second electrode is a source.

The first power line is configured to transmit a positive power signal VDD. The second power line is configured to transmit a negative power signal VSS. A potential of the positive power signal VDD is higher than a potential of the negative power signal VSS. The data line is configured to transmit a data signal Data. The light-emitting control line is configured to transmit the light-emitting control signal EM. The first initialization line is configured to transmit a first initialization signal Vil. The second initialization line is configured to transmit a second initialization signal. The third initialization line is configured to transmit a third initialization signal Vi3. The first gate drive line is configured to transmit the Nth-level negative pulse gate drive signal Pout[N]. The Nth-level positive pulse gate drive line (the second gate drive line) is configured to transmit the Nth-level positive pulse gate drive signal Nout[N]. The (N−L)th-level positive pulse gate drive line (second gate drive line) is configured to transmit the (N−L)th-level positive pulse gate drive signal Nout[N−L]. The third gate drive line is configured to transmit the gate drive signal Pscan2.

Figure 22:
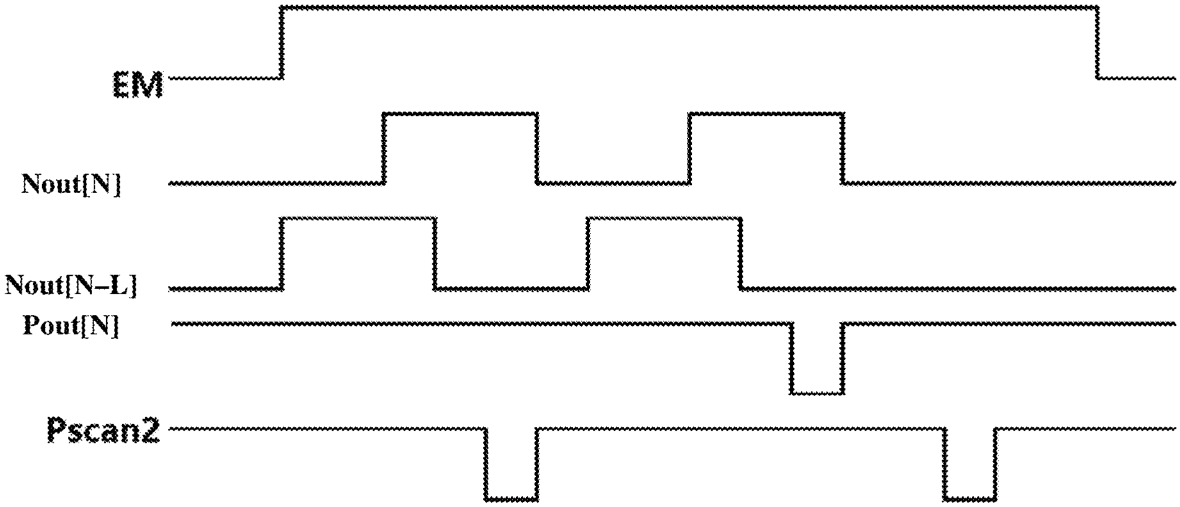
FIG. 22 is a schematic diagram of timing of the pixel circuit shown in FIG. 21.

Working timing of the pixel circuit shown in FIG. 21 in one frame is shown in FIG. 22. The pixel circuit shown in FIG. 21 may perform normal display by common driving of the Nth-level negative pulse gate drive signal Pout[N], the gate drive signal Pscan2, the (N−L)th-level positive pulse gate drive signal Nout[N−L], the Nth-level positive pulse gate drive signal Nout[N], and the light-emitting control signal EM.

The Nth-level negative pulse gate drive signal Pout[N], the (N−L)th-level positive pulse gate drive signal Nout[N−L], and the Nth-level positive pulse gate drive signal Nout [N] may be provided by the gate drive circuit shown in FIG. 3.

In the foregoing embodiments, the descriptions of the embodiments have different focuses. For a part that is not detailed in an embodiment, reference may be made to the relevant description of another embodiment.

The gate drive circuit and the display panel provided in embodiments of the present disclosure are described above in detail. Although the principles and implementations of the present disclosure are described by using specific examples in this specification, the descriptions of the foregoing embodiments are merely intended to help understand the technical solutions and the core idea of the present disclosure. A person of ordinary skill in the art should understand that modifications may still be made to the technical solutions described in the foregoing embodiments, or equivalent replacements may be made to some technical features; and these modifications or replacements will not cause the essence of corresponding technical solutions to depart from the scope of the technical solutions in the embodiments of the present disclosure.

What is claimed is:

1. A display panel, comprising:

a plurality of pixel circuits each comprising a write transistor configured to control input of a data signal and a compensation transistor configured to control input of the data signal to a gate of a drive transistor; and a gate drive circuit comprising a plurality of shift registers, each of the plurality of shift registers comprising:

a cascade transmission signal selection sub-circuit electrically connected between a first wire and a first node;

a pull-up control module configured to control a potential of a second node based on a potential of the first node and a potential of a first clock signal:

a pulse quantity reduction sub-circuit electrically connected between the second node and a third node, wherein a control terminal of the pulse quantity reduction sub-circuit is electrically connected to a reset line;

a first inverting sub-circuit connected between the second node and a fourth node;

a first output module configured to output a first gate drive signal based on a potential of the third node and a potential of the fourth node:

a second output module comprising a first transistor of P-channel and a second transistor of N-channel, wherein a first electrode of the first transistor is electrically connected to a high potential line, a gate of the first transistor is electrically connected to the second node, a first electrode of the second transistor is electrically connected to a second electrode of the first transistor to output a second gate drive signal, and a gate of the second transistor is electrically connected to the gate of the first transistor; and a voltage boosting sub-circuit connected in series between a second electrode of the second transistor and a low potential line, wherein a control terminal of the voltage boosting sub-circuit is electrically connected to the gate of the second transistor, wherein an output terminal of the first output module is electrically connected to a gate of the write transistor, and an output terminal of the second output module is electrically connected to a gate of the compensation transistor.

2. The display panel as claimed in claim 1, wherein the voltage boosting sub-circuit comprises at least one transistor connected in series between the second electrode of the second transistor and the low potential line, and a gate of each of the at least one transistor is electrically connected to the gate of the second transistor.

3. The display panel as claimed in claim 2, wherein the at least one transistor comprises a third transistor, a first electrode of the third transistor is electrically connected to the second electrode of the second transistor, a second electrode of the third transistor is electrically connected to the low potential line, a gate of the third transistor is electrically connected to the gate of the second transistor, and a channel type of the third transistor is same as a channel type of the second transistor.

4. The display panel as claimed in claim 3, wherein each of the gate of the second transistor and the gate of the third transistor comprises a first gate and a second gate, and the second node is electrically connected to the first gate of the second transistor, the second gate of the second transistor, the first gate of the third transistor, and the second gate of the third transistor.

5. The display panel as claimed in claim 4, wherein a potential of the second electrode of the second transistor is less than or equal to −6.7 V when the third transistor is turned on; and each of the second transistor and the third transistor is an indium gallium zinc oxide thin film transistor.

6. The display panel as claimed in claim 4, wherein a width-to-length ratio of a channel of the third transistor is greater than or equal to 8.57 and less than or equal to 20; and each of the second transistor and the third transistor is an indium gallium zinc oxide thin film transistor.

7. The display panel as claimed in claim 3, wherein the at least one transistor further comprises a fourth transistor, a first electrode of the fourth transistor is electrically connected to the second electrode of the third transistor, a second electrode of the fourth transistor is electrically connected to the low potential line, a gate of the fourth transistor is electrically connected to the gate of the second transistor, and a channel type of the fourth transistor is same as the channel type of the third transistor.

8. The display panel as claimed in claim 1, wherein the voltage boosting sub-circuit is configured to boost a potential of the second electrode of the second transistor when the potential of the second node is low.

9. The display panel as claimed in claim 1, wherein the voltage boosting sub-circuit is configured to boost a potential of the second gate drive signal and stabilize the potential of the second gate drive signal at a high potential.

* * * * *